US012787340B2

(12) United States Patent
Ozaki et al.

(10) Patent No.: US 12,787,340 B2
(45) Date of Patent: Nov. 3, 2026

(54) SEMICONDUCTOR DEVICE, SEMICONDUCTOR DEVICE MANUFACTURING METHOD, AND ELECTRONIC DEVICE

(71) Applicant: 1FINITY Inc., Kawasaki (JP)

(72) Inventors: Shirou Ozaki, Yamato (JP); Naoya Okamoto, Isehara (JP); Yusuke Kumazaki, Atsugi (JP); Toshihiro Ohki, Hadano (JP); Naoki Hara, Sagamihara (JP)

(73) Assignee: 1FINITY Inc., Kawasaki (JP)

( * ) Notice: Subject to any disclaimer, the term of this patent is extended or adjusted under 35 U.S.C. 154(b) by 697 days.

(21) Appl. No.: 18/065,177

(22) Filed: Dec. 13, 2022

(65) Prior Publication Data

US 2023/0317839 A1 Oct. 5, 2023

(30) Foreign Application Priority Data

Mar. 15, 2022 (JP) ................................ 2022-040057

(51) Int. Cl.
*H01L 29/778* (2006.01)
*H10D 30/47* (2025.01)
*H10D 64/27* (2025.01)

(52) U.S. Cl.
CPC ....... *H10D 30/4732* (2025.01); *H10D 64/519* (2025.01)

(58) Field of Classification Search
CPC ............. H10D 30/4732; H10D 64/519; H10D 30/475; H10D 30/015; H10D 30/4738; H10D 62/117; H10D 64/518; H10D 64/691
See application file for complete search history.

(56) References Cited

U.S. PATENT DOCUMENTS

2009/0146185 A1* 6/2009 Suh ...................... H10D 30/472 257/E27.061
2009/0166815 A1* 7/2009 Makiyama ........ H01L 21/02274 438/763
2017/0317202 A1* 11/2017 Green ................ H10D 30/4755
2021/0111277 A1* 4/2021 Taniguchi ............. H10D 30/67

FOREIGN PATENT DOCUMENTS

JP H 05-291306 A 11/1993
JP 2002-124664 A 4/2002
JP 2002-270821 A 9/2002
JP 2003-258004 A 9/2003

* cited by examiner

*Primary Examiner* — Mohammed R Alam
(74) *Attorney, Agent, or Firm* — ArentFox Schiff LLP

(57) ABSTRACT

A semiconductor device includes a protection film having an opening and covering a semiconductor layer, which is formed on a side of a surface of a substrate, on an opposite side of the substrate. An insulating film containing silicon is used for the protection film. A gate electrode is formed in the opening and on a side of a side surface of the semiconductor layer which faces a direction. An insulating film containing metal element is formed between the side surface of the semiconductor layer and the gate electrode. The exposure of the side surface of the semiconductor layer to a gas for dry etching for forming of the opening is suppressed by the insulating film. Furthermore, contact and a short circuit between the gate electrode and the side surface of the semiconductor layer are suppressed. As a result, deterioration in the performance of the semiconductor device is suppressed.

18 Claims, 23 Drawing Sheets

SEMICONDUCTOR DEVICE, SEMICONDUCTOR DEVICE MANUFACTURING METHOD, AND ELECTRONIC DEVICE

CROSS-REFERENCE TO RELATED APPLICATION

This application is based upon and claims the benefit of priority of the prior Japanese Patent Application No. 2022-040057, filed on Mar. 15, 2022, the entire contents of which are incorporated herein by reference.

FIELD

The embodiments discussed herein relate to a semiconductor device, a semiconductor device manufacturing method, and an electronic device.

BACKGROUND

The following hetero-junction field effect transistor is known. With such a hetero-junction field effect transistor elements each having a heteroepitaxial structure in which a semiconductor layer having a large band gap, a semiconductor layer having a small band gap, and a semiconductor layer having a large band gap are laminated in order over a substrate are electrically separated by etching. The following technique is known regarding such a hetero-junction field effect transistor. A semiconductor layer having a small band gap exposed on an etched end surface is retreated by selective etching and the semiconductor layer and a gate electrode formed on an isolation etching level difference portion are spatially separated. Furthermore, the following technique is known. After a semiconductor layer having a small band gap exposed on an etched end surface is retreated, an insulating film, such as silicon oxide ($SiO_2$), is deposited. A gate electrode and the semiconductor layer are separated by a space formed by the insulating film.

Moreover, the following field effect semiconductor device is known. With such a field effect semiconductor device, a semiconductor layer including a channel layer over a substrate is etched to form an isolation region, the channel layer exposed on the side of the isolation region is etched to form an air gap, and a gate electrode is formed from over the semiconductor layer across the air gap.

Furthermore, the following mesa type semiconductor device is known. With such a mesa type semiconductor device, an end of an electrode is in contact with a top semiconductor layer of a reverse taper mesa and the electrode is formed so as not to float up from the top semiconductor layer. The electrode is opposed to an active semiconductor layer which directly participates in the operation of an element on a side portion of the mesa with a gap therebetween. With such a mesa type semiconductor device, a technique for making the gap between the electrode and the active semiconductor layer an air gap or a technique for filling in the gap between the electrode and the active semiconductor layer with $SiO_2$, which is a dielectric, is known.

In addition, the following compound field effect semiconductor device is known. With such a compound field effect semiconductor device, compound semiconductor layers are laminated to form a mesa and an oxide insulating film is formed on a side wall of the compound semiconductor layers. With such a compound field effect semiconductor device, a technique for forming the oxide insulating film on the side wall of the compound semiconductor layers by the use of a liquid phase oxidation method or by the use of both of the liquid phase oxidation method and a steam oxidation method or a technique for suppressing, for example, contact between a metal gate and the compound semiconductor layers by the oxide insulating film is known.

See, for example, Japanese Laid-open Patent Publication No. H05-291306, Japanese Laid-open Patent Publication No. 2002-270821, Japanese Laid-open Patent Publication No. 2003-258004, and Japanese Laid-open Patent Publication No. 2002-124664.

By the way, with a semiconductor device in which semiconductor elements, such as transistors, are realized by the use of a semiconductor layer formed over a substrate, the semiconductor layer may be covered with a protection film. A silicon (Si)-based insulating film, such as $SiO_2$ or silicon nitride (SiN), containing Si is widely used as the protection film.

With a semiconductor device in which such a protection film is formed, it may be that the protection film which covers a semiconductor layer is etched and that an opening portion for locating an electrode connected to a gate or the like of a semiconductor element is formed. If at this time the protection film is not formed on a side of the semiconductor layer (side which faces a direction parallel surface of a substrate over which the semiconductor layer is formed) or if the protection film formed on a side of the semiconductor layer is removed from the side of the semiconductor layer by etching performed after that, then a state in which the side of the semiconductor layer is exposed arises. If an electrode is located in the opening portion of the protection film so as to be in contact with the side of the semiconductor layer which is put into an exposed state in this way, then a short circuit may occur between the semiconductor layer and the electrode. This leads to deterioration in the performance of the semiconductor device.

SUMMARY

According to an aspect, there is provided a semiconductor device including a substrate, a semiconductor layer formed on the side of a first surface of the substrate, a first insulating film formed so as to cover the semiconductor layer on the opposite side of the substrate, having an opening portion, and containing Si, an electrode formed in the opening portion of the first insulating film and on the side of a second surface of the semiconductor layer which faces a first direction parallel to the first surface of the substrate, and a second insulating film formed between the second surface of the semiconductor layer and the electrode formed on the side of the second surface and containing a metal element.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

A high electron mobility transistor (HEMT) is known as a kind of field effect semiconductor device using a compound semiconductor material. Such a field effect semiconductor device has an excellent low-noise characteristic and is utilized in an amplifier, a signal processing circuit in optical communication, or the like used in a frequency band such as a microwave or a millimeter wave. Of field effect semiconductor devices using a compound semiconductor material, for example, InP (indium phosphide)-based HEMTs using an InP-based material are excellent in high-speed operation and have a low-noise characteristic. Accordingly, InP-based HEMTs using an InP-based material are suitable for the above amplifiers, signal processing circuits, or the like.

With InP-based HEMTs it is difficult to form an insulating region for isolation by an ion implantation method. Accordingly, with InP-based HEMTs a semiconductor layer including a channel layer, a carrier supply layer, and the like is formed over a substrate. After that, the semiconductor layer is made a mesa. By doing so, isolation is performed. If isolation is performed by making the semiconductor layer a mesa, then a side of the semiconductor layer formed over the substrate is exposed on a side of the mesa obtained. With InP-based HEMTs a structure in which a gate electrode is formed so as to extend from on the semiconductor layer made a mesa in this way to the side of the mesa is adopted. In this case, however, a short circuit may occur when the gate electrode comes in contact with a side of the channel layer included in the semiconductor layer. Accordingly, for example, the following may be performed. Selective side etching is performed on the channel layer included in the semiconductor layer to retreat the side of the channel layer from a side of another layer. As a result, a space referred to as an air gap is left between the gate electrode formed on the side of the mesa and the channel layer. By doing so, contact between the gate electrode and the channel layer is suppressed.

By the way, with InP-based HEMTs there are cases where before a gate electrode is formed, an Si-based insulating film, such as SiN, is formed as a protection film (also referred to as a passivation film) so as to cover a semiconductor layer on which isolation and side etching have been performed.

An example of a semiconductor device, such as the above InP-based HEMT, in which isolation by forming a mesa, side etching on a channel layer, and the formation of an Si-based insulating film as a protection film are adopted will now be described by reference to FIG. 1 through FIG. 4C.

Figure 1:
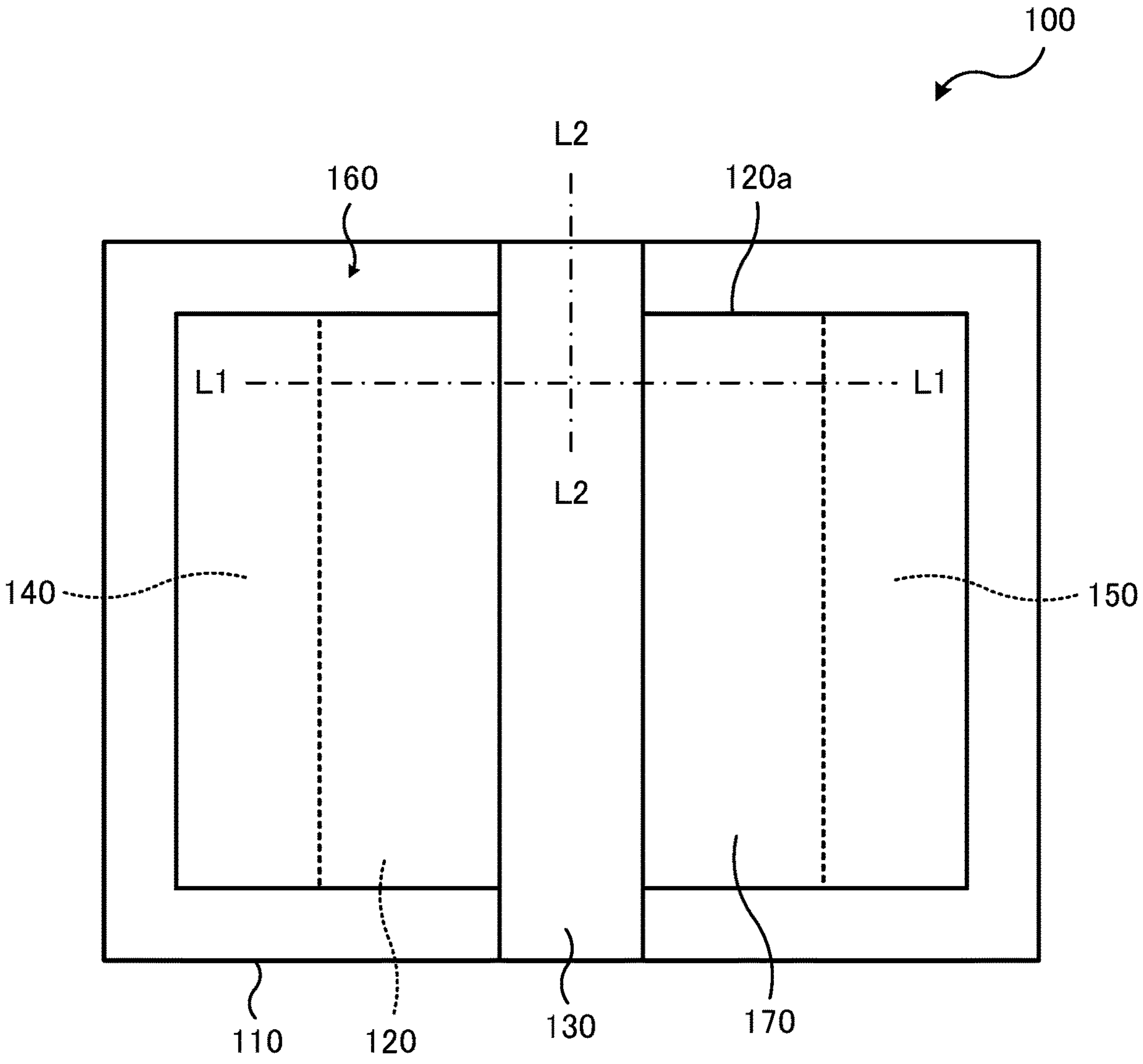
FIG. 1 is a view for describing an example of a semiconductor device.

FIG. 1 is a view for describing an example of a semiconductor device. FIG. 1 is a fragmentary schematic plan view of an example of a semiconductor device.

A semiconductor device 100 illustrated in FIG. 1 includes a substrate 110, a semiconductor layer 120, a gate electrode 130, a source electrode 140, a drain electrode 150, and a protection film 170. The semiconductor layer 120 is formed over the substrate 110. As described later, the semiconductor layer 120 includes a channel layer, a carrier supply layer, and the like. The semiconductor layer 120 is demarcated by an element isolation region 160 formed as a result of the formation of a mesa and isolation is performed. As described later, with the semiconductor layer 120 a side of the channel layer is retreated by side etching from a side of another layer. The source electrode 140 and the drain electrode 150 separated from each other are formed over the semiconductor layer 120 on which the isolation and the side etching have been performed. The protection film 170, which is an Si-based insulating film, is formed so as to cover the semiconductor layer 120 and the source electrode 140 and the drain electrode 150 formed thereover. The gate electrode 130 is formed between the source electrode 140 and the drain electrode 150 over the semiconductor layer 120 and is separated from the source electrode 140 and the drain electrode 150. The gate electrode 130 pierces the protection film 170 and comes in contact with, for example, the semiconductor layer 120. The gate electrode 130 is formed so as to extend from on the semiconductor layer 120 to a side 120*a* of the semiconductor layer 120 (or the element isolation region 160).

Figure 2A:
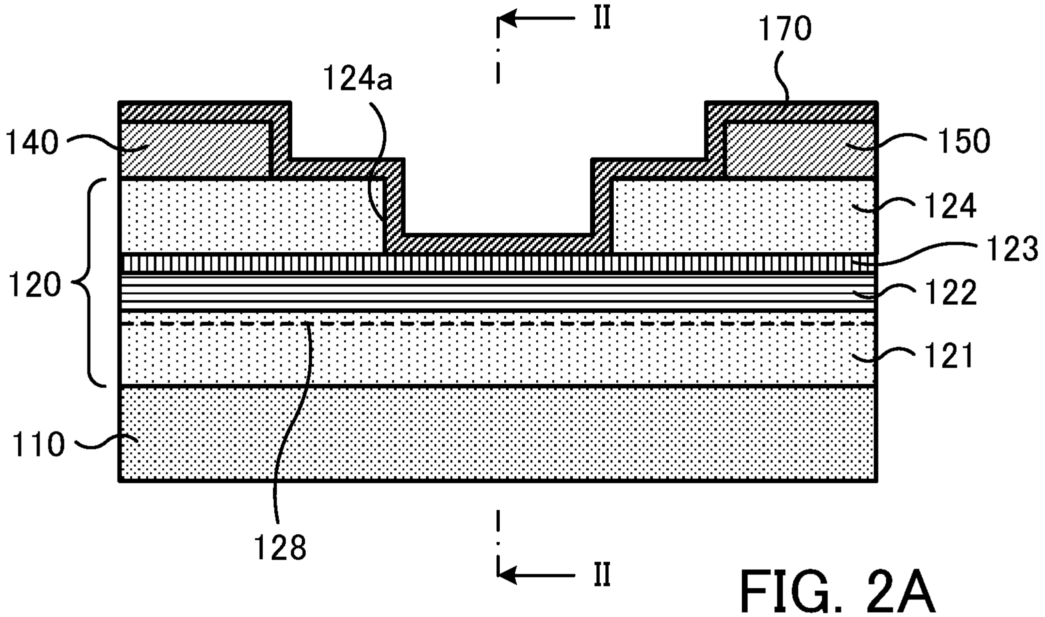
FIGS. 2A and 2B are views for describing an example of a process for manufacturing the semiconductor device (part 1)
Figure 2B:
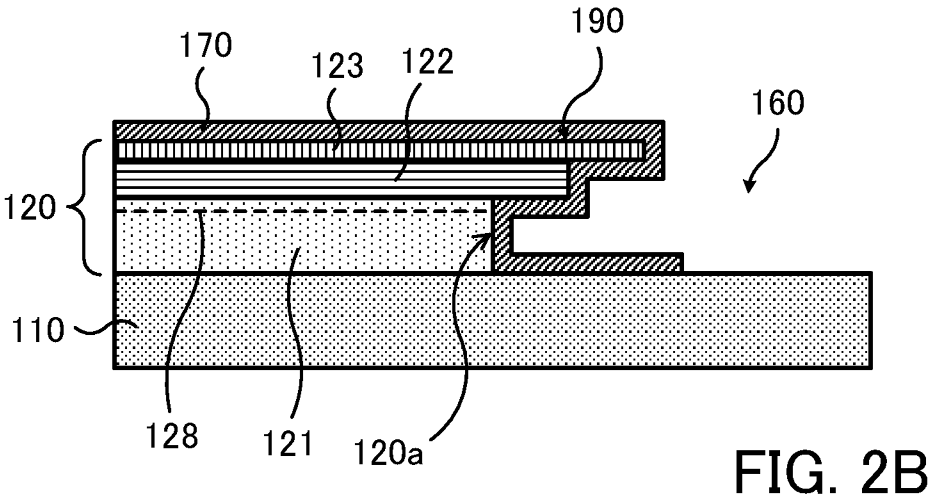
Figure 3A:
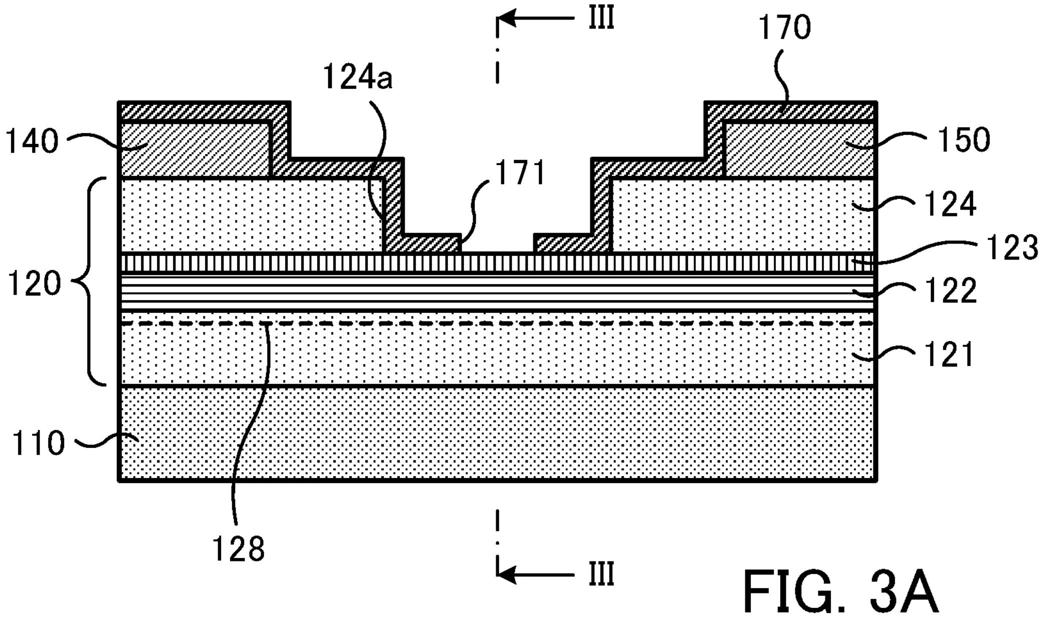
FIGS. 3A and 3B are views for describing an example of a process for manufacturing the semiconductor device (part 2)
Figure 3B:
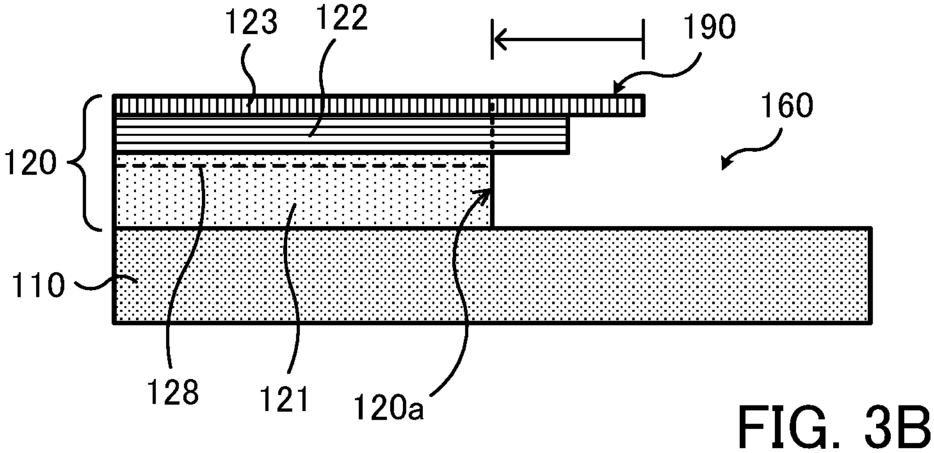
Figure 4A:
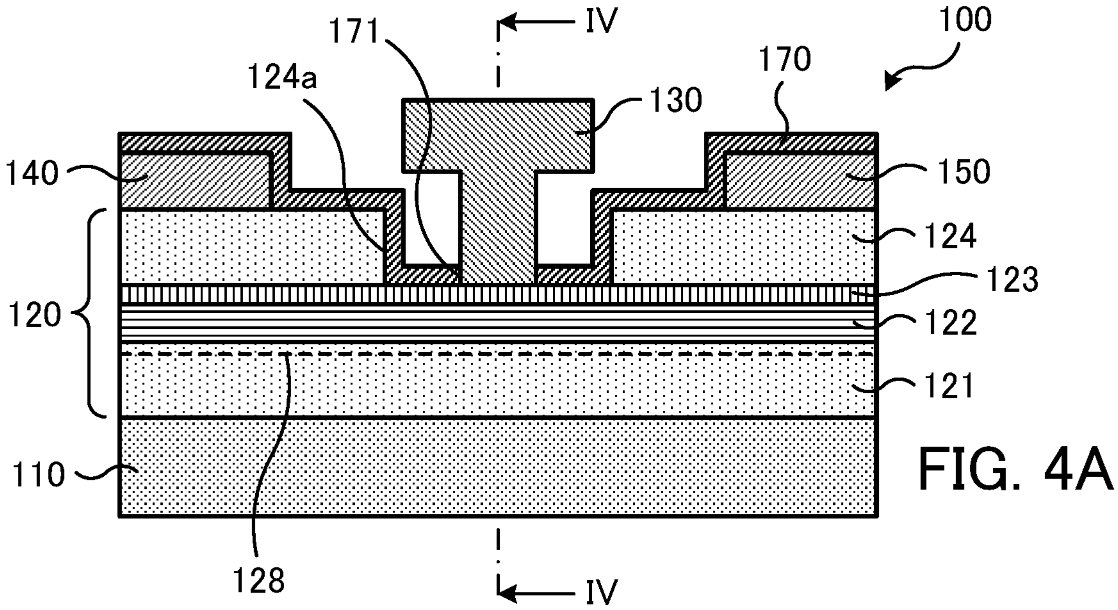
FIGS. 4A through 4C are views for describing an example of a process for manufacturing the semiconductor device (part 3)
Figure 4B:
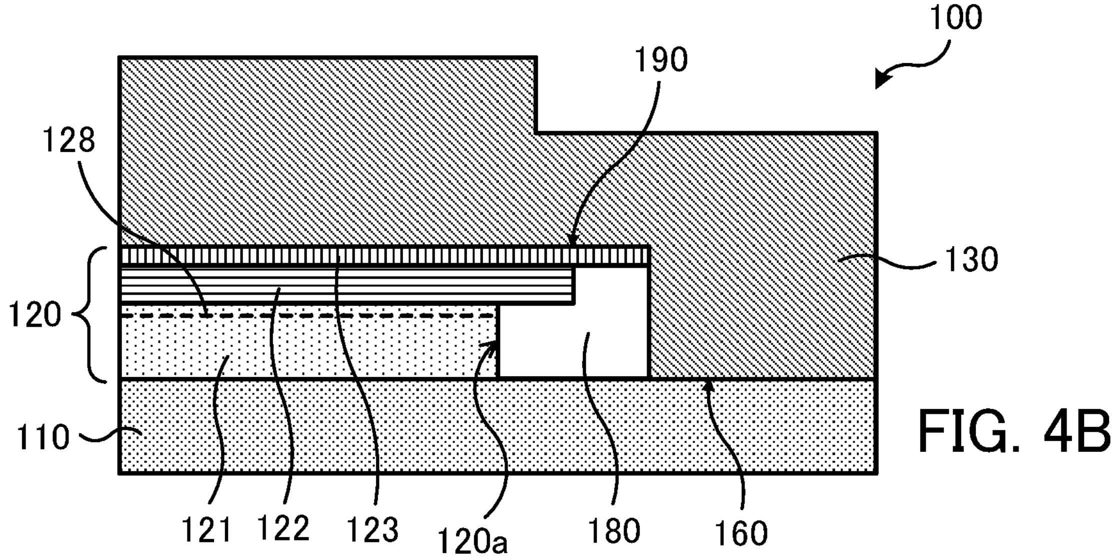
Figure 4C:
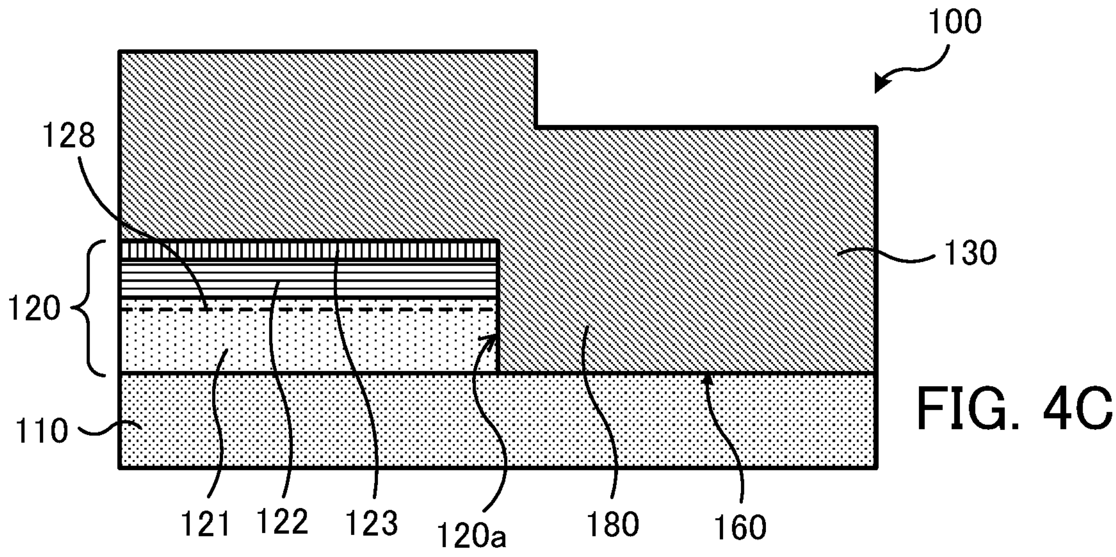

FIG. 2A through FIG. 4C are views for describing an example of a process for manufacturing the semiconductor device. FIGS. 2A and 2B are fragmentary schematic sectional views of an example of a protection film formation process. FIGS. 3A and 3B are fragmentary schematic sectional views of an example of an opening portion formation process. FIGS. 4A through 4C are fragmentary schematic sectional views of an example of a gate electrode formation process. Of FIG. 2A through FIG. 4C, FIG. 2A, FIG. 3A, and FIG. 4A are schematic sectional views taken along the line L1-L1 of FIG. 1. Of FIG. 2A through FIG. 4C, FIG. 2B, FIG. 3B, FIG. 4B, and FIG. 4C are schematic sectional views taken along the line L2-L2 of FIG. 1. FIG. 2B is a schematic sectional view taken along the line II-II of FIG. 2A. FIG. 3B is a schematic sectional view taken along the line III-III of FIG. 3A. FIG. 4B and FIG. 4C are schematic sectional views taken along the line IV-IV of FIG. 4A.

As illustrated in FIG. 2A and FIG. 2B, in order to manufacture the semiconductor device 100 (FIG. 1), first the semiconductor layer 120 is formed over the substrate 110. For example, the semiconductor layer 120 in which a channel layer 121, a carrier supply layer 122, an etching stop layer 123, and a cap layer 124 are laminated in order is formed over the substrate 110. Two-dimensional carrier gas 128 is generated in the channel layer 121 near an interface between the channel layer 121 and the carrier supply layer 122. The semiconductor layer 120 formed over the substrate 110 is made a mesa by etching and isolation is performed. As a result, as illustrated in FIG. 2B, the semiconductor layer 120 demarcated by the element isolation region 160 is formed.

For example, the element isolation region 160 is formed in the following way. A resist mask (not illustrated) having an opening over an area in which the element isolation region 160 is to be formed is formed over the cap layer 124 and the cap layer 124 is etched by the use of, for example, a liquid mixture of phosphoric acid and a hydrogen peroxide solution. This etching is stopped at the surface of the etching stop layer 123. Next, the etching stop layer 123 is etched by the use of, for example, hydrochloric acid. This etching is stopped at the surface of the carrier supply layer 122. After that, the carrier supply layer 122 and the channel layer 121 are etched by the use of, for example, a liquid mixture of phosphoric acid and a hydrogen peroxide solution. The element isolation region 160 is formed in this way. After the element isolation region 160 is formed, the resist mask is removed. As illustrated in FIG. 2B, by forming the element isolation region 160 by the above etching, the etching stop layer 123 and the carrier supply layer 122 form a shape which is such that the etching stop layer 123 and the carrier supply layer 122 extrude outward from the channel layer 121. A peak portion 190 including the etching stop layer 123 and the carrier supply layer 122 and extruding outward from the channel layer 121 is formed on the side 120*a* of the semiconductor layer 120.

After the element isolation region 160 is formed, the source electrode 140 and the drain electrode 150 are formed over the cap layer 124 of the semiconductor layer 120. After that, the cap layer 124 between the source electrode 140 and the drain electrode 150 is etched and a recess 124*a* which communicates with the etching stop layer 123 is formed in the cap layer 124. After the recess 124*a* is formed, the protection film 170 made of SiN or the like is formed so as to cover the semiconductor layer 120 and the source electrode 140 and the drain electrode 150 formed thereover.

The structure illustrated in FIG. 2A and FIG. 2B is obtained by the above process.

Next, as illustrated in FIG. 3A and FIG. 3B, an opening portion which 171 communicates with the semiconductor layer 120 (etching stop layer 123 in the recess 124*a*) is formed in an area of the protection film 170 in which the gate electrode 130 is to be formed. For example, the opening portion 171 is formed by a lithography technique and a dry etching technique using fluorine-based gas.

If the protection film 170 formed on the side 120*a* of the semiconductor layer 120 is not coated or is not sufficiently coated with a resist mask (not illustrated) when the opening portion 171 is formed, then, as illustrated in FIG. 3B, the protection film 170 on the side 120*a* may be removed. If the protection film 170 on the side 120*a* is removed, then the side 120*a* is exposed. The etching stop layer 123 and the carrier supply layer 122 form a shape which is such that the etching stop layer 123 and the carrier supply layer 122 extrude outward from the channel layer 121. As a result, the etching stop layer 123 and the carrier supply layer 122 (included in the peak portion 190) are exposed.

In order to restrain the distance between the channel layer 121 and the gate electrode 130 described later with the etching stop layer 123 and the carrier supply layer 122 therebetween to a determined value, the etching stop layer 123 formed is thinner than the channel layer 121. Accordingly, if the comparatively thin etching stop layer 123 which is exposed as a result of removal of the protection film 170 is exposed further after removal of the protection film 170 to fluorine-based gas used in dry etching, then the etching stop layer 123 may disappear. Furthermore, if the carrier supply layer 122 which becomes bare as a result of the disappearance of the etching stop layer 123 is exposed further to fluorine-based gas and disappears, then, as indicated by an arrow and a dotted line in FIG. 3B, the extrusive peak portion 190 may disappear. The influence of the disappearance of the peak portion 190 will be described later.

As illustrated in FIG. 4A and FIG. 4B, for example, the gate electrode 130 is formed after the opening portion 171 is formed by dry etching. The gate electrode 130 is formed over the semiconductor layer 120 in the opening portion 171 (over the etching stop layer 123 in the recess 124*a*) and extends from over the semiconductor layer 120, through the side 120*a*, to the element isolation region 160. The above gate electrode 130 is formed and the semiconductor device 100 illustrated in, for example, FIG. 4A and FIG. 4B is manufactured.

The opening portion 171 is formed (FIG. 3A and FIG. 3B) before the gate electrode 130 is formed. At this time a case where the protection film 170 on the side 120*a* of the semiconductor layer 120 is removed and where the peak portion 190 including the etching stop layer 123 and the carrier supply layer 122 is left on the exposed side 120*a* may arise. This case will now be discussed. If the peak portion 190 is left in this way after the opening portion 171 is formed, then, as illustrated in FIG. 4B, a space 180 is formed between the channel layer 121 and the gate electrode 130. This suppresses contact between the channel layer 121 and the gate electrode 130. As a result, a short circuit between the channel layer 121 and the gate electrode 130, that is to say, between the two-dimensional carrier gas 128 generated in the channel layer 121 and the gate electrode 130 is suppressed.

The opening portion 171 is formed (FIG. 3A and FIG. 3B) before the gate electrode 130 is formed. At this time a case where the protection film 170 on the side 120*a* of the semiconductor layer 120 is removed and where the peak portion 190 on the exposed side 120*a* including the etching stop layer 123 and the carrier supply layer 122 disappears (indicated by the arrow and the dotted line in FIG. 3B) may arise. This case will now be discussed. If the peak portion 190 disappears in this way after the opening portion 171 is formed, then a state illustrated in, for example, FIG. 4C may arise. That is to say, the above space 180 is not formed between the channel layer 121 and the gate electrode 130. As a result, contact between the channel layer 121 and the gate electrode 130 may occur and a short circuit may occur between the channel layer 121 and the gate electrode 130. Furthermore, even if the peak portion 190 is left on the side 120*a* of the semiconductor layer 120 exposed from the protection film 170, it may be that a sufficient space 180 is not formed between the channel layer 121 and the gate electrode 130 depending on the degree of the extrusion of the peak portion 190 left. As a result, contact between the channel layer 121 and the gate electrode 130 may occur and therefore a short circuit may occur between the channel layer 121 and the gate electrode 130. This is the same with the above case.

As illustrated in FIG. 4C, for example, if contact between the channel layer 121 exposed on the side 120*a* of the semiconductor layer 120 and the gate electrode 130 occurs and a short circuit occurs between them, then the performance of the semiconductor device 100 may deteriorate. For example, if a short circuit occurs between the channel layer 121 exposed on the side 120*a* of the semiconductor layer 120 and the gate electrode 130, then a leakage current is generated. As a result, a transistor is not sufficiently turned off. That is to say, a pinch-off failure may occur.

In order to suppress the disappearance of the peak portion 190 at the time of the formation of the above opening portion 171, the etching stop layer 123, of the etching stop layer 123 and the carrier supply layer 122, may be made thick. By doing so, the peak portion 190 may be made thick. If the etching stop layer 123 is made thick, then the disappearance of the etching stop layer 123 of the peak portion 190 at the time of the formation of the opening portion 171 may be suppressed. As a result, the disappearance of the carrier supply layer 122 caused by the disappearance of the etching stop layer 123 may be suppressed. However, if the etching stop layer 123 is made thick in this way, then the distance between the channel layer 121 and the gate electrode 130 with the etching stop layer 123 and the carrier supply layer 122 therebetween increases and the strength of an electric field applied from the gate electrode 130 to the channel layer 121 weakens. As a result, the high-frequency characteristic of the semiconductor device 100 may deteriorate.

In the above example, the protection film 170 formed on the side 120*a* of the semiconductor layer 120 is removed from the side 120*a* at the time of forming the opening portion 171 by dry etching and the peak portion 190 disappears. As a result, contact between the channel layer 121 and the gate electrode 130 occurs and a short circuit occurs between them. Furthermore, in a case where the protection film 170 is used and where a process in which the protection film 170 is not originally formed on the side 120*a* of the semiconductor layer 120 is adopted, the same may occur. That is to say, if the peak portion 190 disappears by dry etching performed at the time of forming the opening portion 171, then contact between the channel layer 121 and the gate electrode 130 may occur and therefore a short circuit may occur between them.

When dry etching is performed on the protection film 170, etching gas other than fluorine-based gas may be used. Even if etching gas other than fluorine-based gas is used, the exposed side 120*a* of the semiconductor layer 120 is exposed to the etching gas. As a result, the same that occurs in the case of fluorine-based gas being used may occur.

In view of the above problems, a semiconductor device which suppresses deterioration in performance caused by a short circuit between a semiconductor layer and an electrode is realized by the use of techniques described below as embodiments.

First Embodiment

Figure 5A:
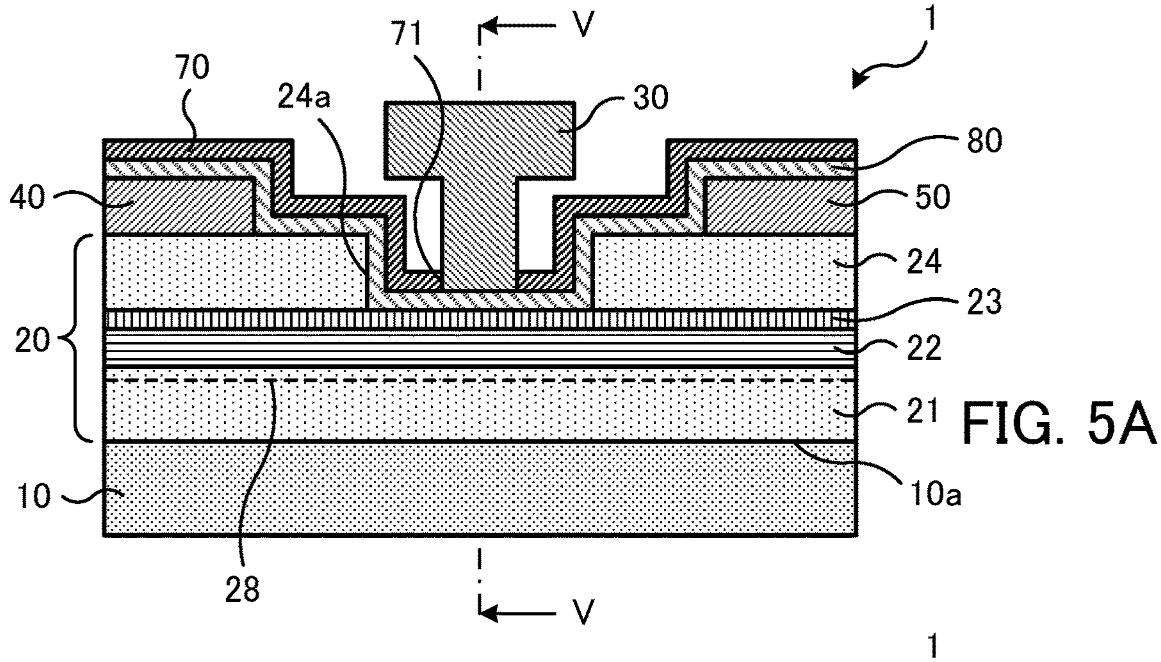
FIGS. 5A through 5C are views for describing an example of a semiconductor device according to a first embodiment.
Figure 5B:
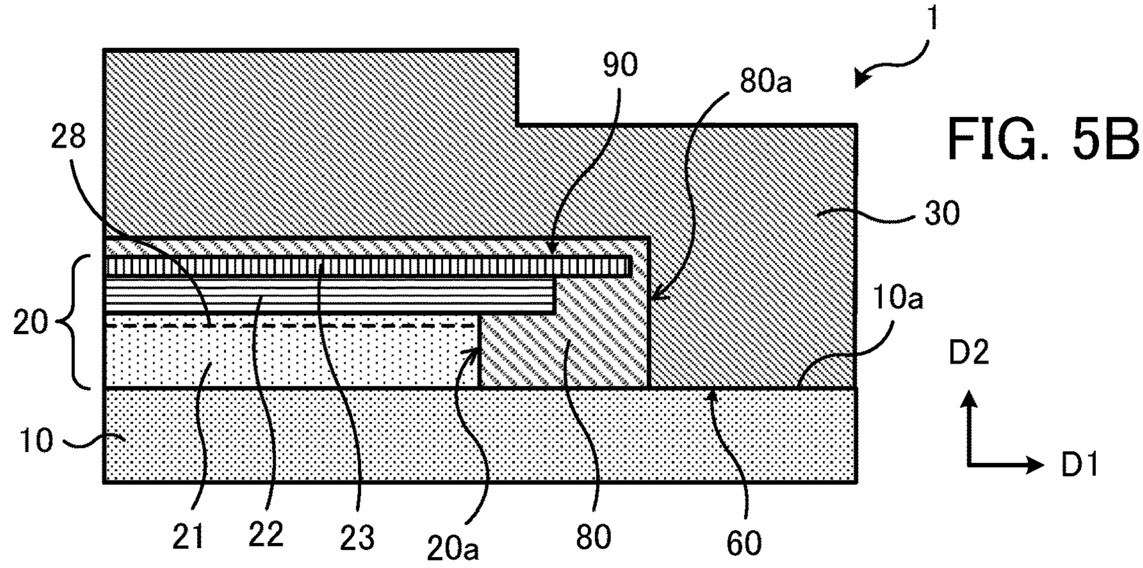
Figure 5C:
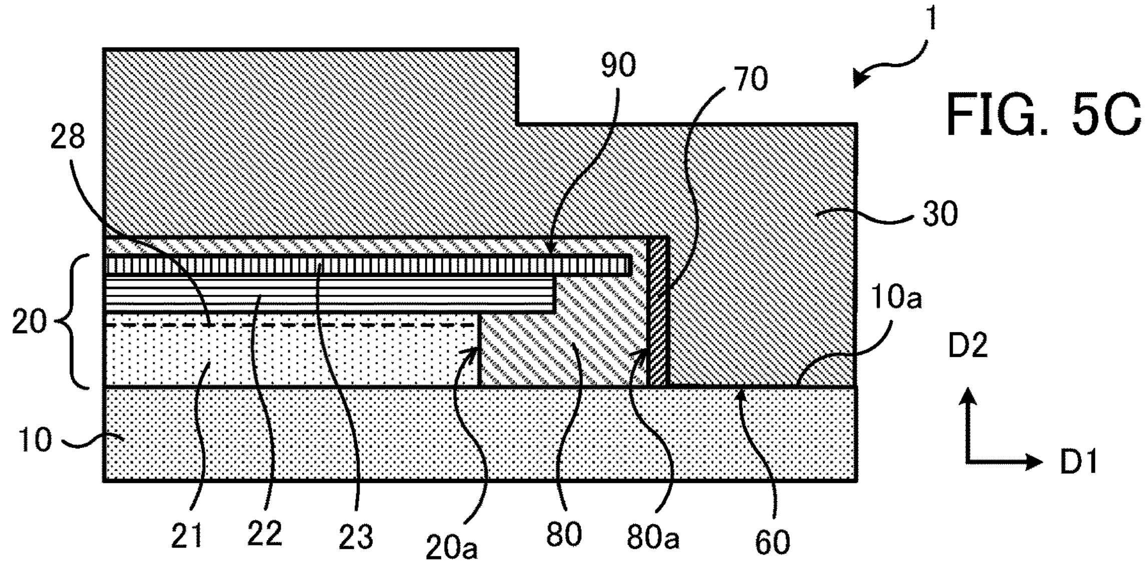

FIGS. 5A through 5C are views for describing an example of a semiconductor device according to a first embodiment. Each of FIGS. 5A through 5C is a fragmentary schematic sectional view of an example of a semiconductor device. FIG. 5B is a first example of a schematic sectional view taken along the line V-V of FIG. 5A. FIG. 5C is a second example of a schematic sectional view taken along the line V-V of FIG. 5A.

As illustrated in FIG. 5A, for example, a semiconductor device 1 includes a substrate 10, a semiconductor layer 20, a gate electrode 30, a source electrode 40, a drain electrode 50, a protection film 70, and an insulating film 80. The semiconductor device 1 is an example of an HEMT.

A compound semiconductor substrate is used as the substrate 10. For example, an InP substrate is used as the substrate 10. A compound semiconductor substrate, which is a foundation substrate, over which a compound semiconductor layer, such as a buffer layer, is formed may be used as the substrate 10. For example, an InP substrate over which indium aluminum arsenide (InAlAs) is formed as a buffer layer may be used as the substrate 10.

As illustrated in FIG. 5A, the semiconductor layer 20 is formed over one surface 10*a* (also referred to as a first surface) of the substrate 10. The semiconductor layer 20 has a structure in which a channel layer 21 and a carrier supply layer 22 (layer including the channel layer 21 and the carrier supply layer 22 is also referred to as a first layer), an etching stop layer 23 (also referred to as a second layer), and a cap layer 24 are laminated in order from the side of the surface 10*a* of the substrate 10. The channel layer 21, the carrier supply layer 22, the etching stop layer 23, and the cap layer 24 are formed by the use of a compound semiconductor material. The channel layer 21 is formed by the use of, for example, indium gallium arsenide (InGaAs). The carrier supply layer 22 is formed by the use of, for example, indium aluminum arsenide (InAlAs). The etching stop layer 23 is formed by the use of, for example, InP or indium gallium phosphide (InGaP). The cap layer 24 is formed by the use of, for example, InGaAs. A recess 24*a* which communicates with the etching stop layer 23 is formed in the cap layer 24. Two-dimensional carrier gas 28 is generated in the channel layer 21 near an interface between the channel layer 21 and the carrier supply layer 22.

As illustrated in FIG. 5A, the source electrode 40 and the drain electrode 50 are formed over the cap layer 24 (over the semiconductor layer 20 on the opposite side of the substrate 10). The source electrode 40 and the drain electrode 50 are separated from each other and are located in positions opposite each other with the recess 24*a* of the cap layer 24 therebetween. Each of the source electrode 40 and the drain electrode 50 is made of a metal material such as titanium (Ti), platinum (Pt), or gold (Au). The source electrode 40 and the drain electrode 50 are located so as to function as an ohmic electrode.

As illustrated in FIG. 5A, the protection film 70 (also referred to as a first insulating film) is formed so as to cover the semiconductor layer 20 on the opposite side of the substrate 10. The protection film 70 is formed so as to cover the cap layer 24, the etching stop layer 23 in the recess 24*a* of the cap layer 24, and the source electrode 40 and the drain electrode 50 over the cap layer 24. An insulating film containing Si, that is to say, an Si-based insulating film is used as the protection film 70. For example, SiN is used as the protection film 70. An opening portion 71 is formed in the protection film 70 so as to be situated in the recess 24*a* of the cap layer 24.

As illustrated in FIG. 5A, the gate electrode 30 (also referred to as an electrode) is formed between the source electrode 40 and the drain electrode 50 so as to be situated in the opening portion 71 of the protection film 70 formed in the recess 24*a* of the cap layer 24. The gate electrode 30 is separated from the source electrode 40 and the drain electrode 50. The gate electrode 30 is made of a metal material such as Ti, Pt, or Au. For example, the gate electrode 30 is formed over the semiconductor layer 20 on the opposite side of the substrate 10 so as to have a section in the shape of the letter "T".

As illustrated in FIG. 5A, the insulating film 80 (also referred to as a second insulating film) is formed so as to cover the cap layer 24, the etching stop layer 23 in the recess 24*a* of the cap layer 24, and the source electrode 40 and the drain electrode 50 over the cap layer 24. The insulating film 80 is formed between the semiconductor layer 20 and the protection film 70 over the semiconductor layer 20 on the opposite side of the substrate 10. The opening portion 71 of the protection film 70 is formed so as to communicate with the insulating film 80. A lower end of the gate electrode 30 formed in the opening portion 71 of the protection film 70 is in contact with the insulating film 80. The gate electrode 30 is formed over the semiconductor layer 20 with the insulating film 80 therebetween.

An insulating film containing a metal element is used as the insulating film 80. For example, an oxide film containing aluminum (Al) as a metal element, that is to say, aluminum oxide ($Al_2O_3$) is used as the insulating film 80. The insulating film 80 may contain as a metal element hafnium (Hf), zirconium (Zr), Ti, tantalum (Ta), magnesium (Mg), scandium (Sc), yttrium (Y), lanthanum (La), strontium (Sr) or the like in place of Al. For example, the insulating film 80 contains a metal element having an electronegativity of 1.8 or less. For example, an oxide film, a nitride film, or an oxynitride film containing one or more of Al, Hf, Zr, Ti, Ta, Mg, Sc, Y, La, and Sr is used as the insulating film 80. A laminated structure of two or more of the above oxide film, nitride film, and oxynitride film may be used as the insulating film 80.

With the semiconductor device 1 having the structure illustrated in FIG. 5A, isolation is performed by making the semiconductor layer 20 a mesa. FIG. 5B illustrates an example of the structure of a portion near an element isolation region 60 formed at the end of the semiconductor layer 20 in the direction of the depth of the paper surface by making the semiconductor layer 20 included in the semiconductor device 1 illustrated in FIG. 5A a mesa.

As illustrated in FIG. 5B, for example, in section along a position in which the gate electrode 30 is formed, a side of the channel layer 21, a side of the carrier supply layer 22, and a side of the etching stop layer 23 are situated on a side 20*a* of the semiconductor layer 20 on the element isolation region 60, that is to say, on the side 20*a* (also referred to as a second surface) which faces a direction D1 (also referred to as a first direction) parallel to the surface 10*a* of the substrate 10. For example, the etching stop layer 23 has a shape which is such that the etching stop layer 23 extrudes outward from the side of the carrier supply layer 22 formed thereunder. The carrier supply layer 22 has a shape which is such that the carrier supply layer 22 extrudes outward from the side of the channel layer 21 formed thereunder. A peak portion 90 including the etching stop layer 23 and the carrier supply layer 22 and extruding outward from the side of the channel layer 21 is located over the channel layer 21. The shape of such a level difference on the side 20*a* of the semiconductor layer 20 is realized by etching performed at the time of forming the element isolation region 60.

As illustrated in FIG. 5A, the insulating film 80 is formed over the semiconductor layer 20 on the opposite side of the substrate 10 so as to cover the cap layer 24, the etching stop layer 23 in the recess 24*a* of the cap layer 24, and the source electrode 40 and the drain electrode 50 over the cap layer 24. Furthermore, as illustrated in FIG. 5B, the insulating film 80 is formed so as to extend from over the semiconductor layer 20 to the side 20*a* of the semiconductor layer 20 and cover on the side 20*a* the peak portion 90 including the etching stop layer 23 and the carrier supply layer 22 and the channel layer 21. With the insulating film 80 formed on the side 20*a* of the semiconductor layer 20, the thickness in the direction D1 of a portion under the etching stop layer 23 is more than the thickness in the direction D1 of a portion at the side of the etching stop layer 23.

The protection film 70 having the opening portion 71 which communicates with the insulating film 80 is formed over the above insulating film 80 (FIG. 5A) and the gate electrode 30 is formed in the opening portion 71 of the protection film 70. As illustrated in FIG. 5B, the gate electrode 30 is formed so as to extend from over the semiconductor layer 20 (from the opening portion 71 of the protection film 70) to the element isolation region 60 on the side of the side 20*a* of the semiconductor layer 20. As illustrated in FIG. 5B, the insulating film 80 is formed between the side 20*a* of the semiconductor layer 20 and the gate electrode 30 formed so as to extend to the side of the side 20*a*.

When the semiconductor device 1 is manufactured, dry etching using fluorine-based gas is performed on the protection film 70 formed so as to cover the insulating film 80 formed in the way illustrated in, for example, FIG. 5A and FIG. 5B. By doing so, the opening portion 71 is formed. After that, the gate electrode 30 is formed in the opening portion 71.

The peak portion 90 including the etching stop layer 23 and the carrier supply layer 22 and the channel layer 21 formed thereunder are covered with the insulating film 80 and are not exposed. This prevents the peak portion 90 and the channel layer 21 formed thereunder from being exposed to fluorine-based gas at the time of forming the opening portion 71 in the protection film 70 by dry etching. When the protection film 70 is formed so as to cover the insulating film 80, the protection film 70 is formed on a side 80*a* of the insulating film 80 which faces the direction D1. Even if the protection film 70 formed on the side 80*a* of the insulating film 80 is removed at the time of forming the opening portion 71 by dry etching, the same applies. That is to say, even in that case, the peak portion 90 and the channel layer 21 formed thereunder are covered with the insulating film 80 and are not exposed. This prevents the peak portion 90 and the channel layer 21 formed thereunder from being exposed to fluorine-based gas.

As a result, the disappearance of part of the side 20*a* of the semiconductor layer 20 is suppressed. For example, the disappearance of the etching stop layer 23 included in the peak portion 90 or the etching stop layer 23 and the carrier supply layer 22 included in the peak portion 90 is suppressed. Furthermore, because the side 20*a* of the semiconductor layer 20 is covered with the insulating film 80, contact between the gate electrode 30 formed after the formation of the opening portion 71 in the protection film 70 by dry etching and the channel layer 21 on the side 20*a* of the semiconductor layer 20 is suppressed. With the semiconductor device 1 contact between the gate electrode 30 and the channel layer 21 on the side 20*a* of the semiconductor layer 20 is suppressed in this way. Accordingly, a short circuit between the gate electrode 30 and the channel layer 21, that is to say, between the two-dimensional carrier gas 28 generated in the channel layer 21 and the gate electrode 30 is suppressed. As a result, deterioration in the performance of the semiconductor device 1 caused by a short circuit between the gate electrode 30 and the channel layer 21 is suppressed.

In a case where the protection film 70 is formed on the side 80*a* of the insulating film 80 when the protection film 70 is formed so as to cover the insulating film 80, the protection film 70 on the side 80*a* may be left after the opening portion 71 is formed by dry etching. FIG. 5C illustrates an example of the structure of the semiconductor device 1 obtained in a case where the protection film 70 is left on the side 80*a* of the insulating film 80 after the opening portion 71 is formed by dry etching and where the gate electrode 30 is formed in that state. The channel layer 21 is separated from the gate electrode 30 by the insulating film 80 which covers the channel layer 21 and the protection film 70 left on the side 80*a* of the insulating film 80. This suppresses contact between the channel layer 21 and the gate electrode 30 and a short circuit between the channel layer 21 and the gate electrode 30 caused by contact between them. By adopting the structure illustrated in FIG. 5C, that is to say, the structure in which the protection film 70 is left on the side 80*a* of the insulating film 80, deterioration in the performance of the semiconductor device 1 caused by a short circuit between the gate electrode 30 and the channel layer 21 is also suppressed.

With the semiconductor device 1, as stated above, the peak portion 90 including the etching stop layer 23 and the carrier supply layer 22 and the channel layer 21 are covered with the insulating film 80. This prevents the peak portion 90 including the etching stop layer 23 and the carrier supply layer 22 and the channel layer 21 from being exposed to fluorine-based gas used etching. Accordingly, the disappearance of the peak portion 90 caused by exposure to fluorine-based gas is suppressed. Because the disappearance of the peak portion 90 is suppressed, there is no need to set the thickness of the peak portion 90, that is to say, the thickness of the peak portion 90 in a direction D2 (also referred to as a second direction) perpendicular to the surface 10*a* of the substrate 10 to thickness which is such that the peak portion 90 may resist disappearance caused by dry etching. For example, the thickness of the etching stop layer 23 may be set to thickness which is such that etching performed at the time of forming the recess 24*a* of the cap layer 24 may be stopped. For example, the thickness of the etching stop layer 23 may be set to 5 nm or less. A decrease in the thickness of the etching stop layer 23 suppresses an increase in the distance between the gate electrode 30 and the channel layer 21 with the etching stop layer 23 and the carrier supply layer 22 therebetween. As a result, deterioration in the high-frequency characteristic of the semiconductor device 1 is suppressed. In order to suppress an increase in the distance between the gate electrode 30 and the channel layer 21 with the etching stop layer 23 and the carrier supply layer 22 therebetween, it is desirable to set the thickness of the etching stop layer 23 to half or less of the thickness in the direction D2 of the channel layer 21.

The insulating film 80 of the semiconductor device 1 will be described further.

It is desirable that the insulating film 80 have sufficient etching resistance to fluorine-based gas used in dry etching performed on the protection film 70 before the formation of the gate electrode 30. Even if the insulating film 80 having sufficient etching resistance is exposed to fluorine-based gas in a state in which the insulating film 80 is not covered with the protection film 70 or in a state in which the insulating film 80 gets uncovered with the progress of dry etching, the disappearance of the insulating film 80 is suppressed and the semiconductor layer 20 is protected against fluorine-based gas.

With the semiconductor device 1 an insulating film containing a metal element having an electronegativity of 1.8 or less is used as the insulating film 80 from this point of view. For example, an insulating film containing one or more of the above metal elements, such as Al, Hf, Zr, Ti, Ta, Mg, Sc, Y, La, and Sr, is used as the insulating film 80. The reason for this is as follows. If an electronegativity differential between a metal element and fluorine having an electronegativity of 3.98 is greater, then fluoride generated at the time of dry etching using fluorine-based gas and containing such a metal element has a higher ionic-bonding property. Accordingly, such fluoride has a higher boiling point and higher etching resistance.

For example, when insulating films containing Si, Al, Hf, and Zr, which are metal elements, are in an environment in which dry etching using fluorine-based gas is performed, then $SiF_4$, $AlF_3$, $HfF_4$, and $ZrF_4$, respectively, are generated and are fluoride. The boiling points of $SiF_4$, $AlF_3$, $HfF_4$, and $ZrF_4$ are as follows. The boiling point of $SiF_4$ is −86° C. The boiling point of $AlF_3$ is 1276° C. The boiling point (sublimation temperature) of $HfF_4$ is 970° C. The boiling point (sublimation temperature) of $ZrF_4$ is 912° C. The boiling point of fluoride containing Al, Hf, and Zr each having an electronegativity of 1.8 or less is higher than that of fluoride containing Si having an electronegativity of 1.9. It turns out that Al, Hf, and Zr are hard-to-etch metal elements with respect to fluorine-based gas. From this information it is desirable that an insulating film containing a metal element having an electronegativity of 1.8 or less be used as the insulating film 80 of the semiconductor device 1.

Etching gas other than fluorine-based gas may be used in dry etching performed on the protection film 70. If etching gas other than fluorine-based gas is used, then the electronegativity of a metal element contained in the insulating film 80 is taken into consideration according to a material for the etching gas.

The insulating film 80 having sufficient etching resistance is used. As a result, the disappearance of the insulating film 80 at the time of performing dry etching on the protection film 70 and the exposure of the peak portion 90 and the channel layer 21 and the disappearance of the peak portion 90 caused by the disappearance of the insulating film 80 are effectively suppressed. This suppresses contact between the gate electrode 30 formed after dry etching performed on the protection film 70 and the channel layer 21 or a short circuit between the gate electrode 30 and the channel layer 21 caused by contact between the gate electrode 30 and the channel layer 21. Accordingly, the generation of a leakage current or the occurrence of a pinch-off failure caused by a short circuit between the gate electrode 30 and the channel layer 21 is suppressed and deterioration in the performance of the semiconductor device 1 is suppressed.

Figure 6A:
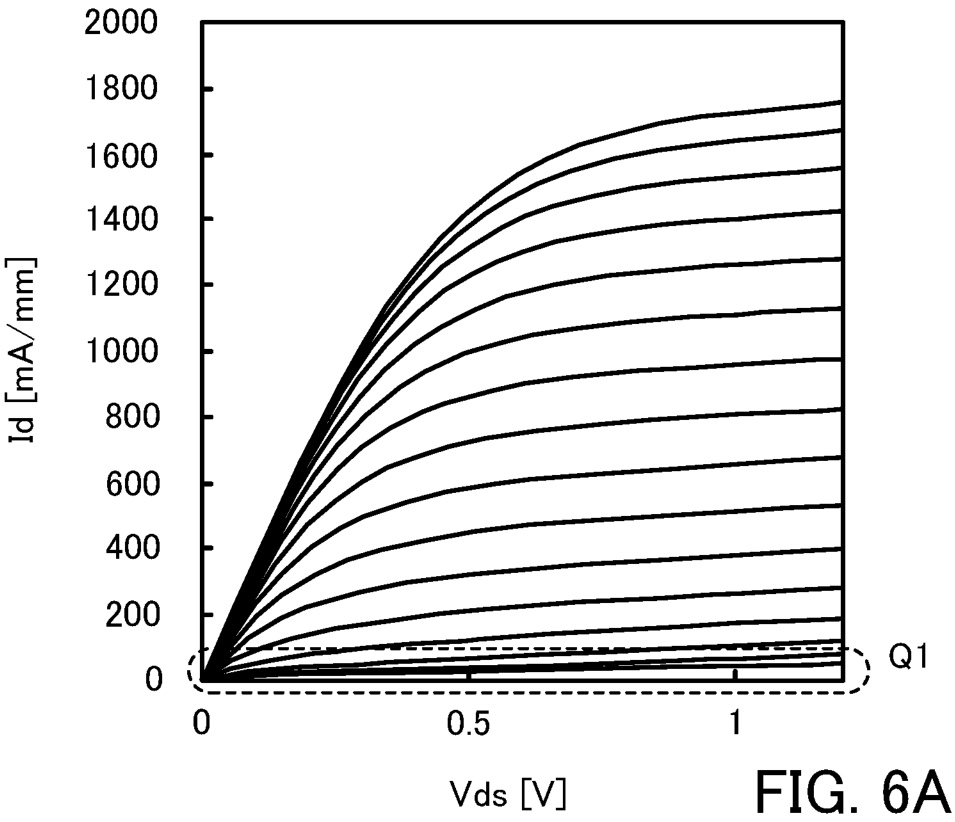
FIGS. 6A and 6B illustrate examples of results obtained by evaluating the characteristics of semiconductor devices.
Figure 6B:
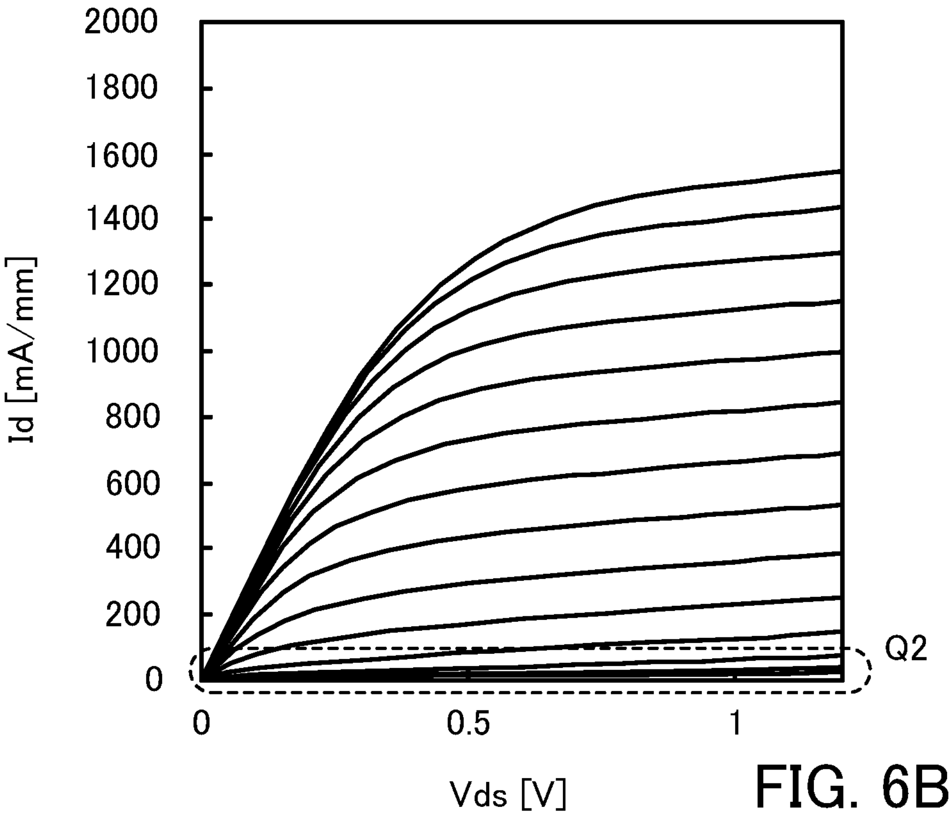

FIGS. 6A and 6B illustrate examples of results obtained by evaluating the characteristics of semiconductor devices.

FIG. 6A illustrates the current-voltage characteristic of the semiconductor device 100 (FIGS. 4A through 4C) in which the above insulating film 80 is not formed. FIG. 6B illustrates the current-voltage characteristic of the semiconductor device 1 (FIGS. 5A through 5C) in which the above insulating film 80 is formed. In each of FIGS. 6A and 6B, a horizontal axis indicates a drain-source voltage Vds (V) and a vertical axis indicates drain current density Id (mA/mm).

As illustrated in FIG. 6A, with the semiconductor device 100 (FIGS. 4A through 4C) in which an insulating film 80 is not formed on the side 120*a* of the semiconductor layer 120, it may be that a transistor is not sufficiently turned off, that is to say, a pinch-off failure may occur (portion Q1 of FIG. 6A). As illustrated in FIG. 4C, such a pinch-off failure occurs because the peak portion 190 of the semiconductor layer 120 disappears at the time of performing dry etching on the protection film 170, contact between the channel layer 121 and the gate electrode 130 occurs, and a short circuit occurs between them.

As illustrated in FIG. 6B, on the other hand, with the semiconductor device 1 (FIG. 5) in which the insulating film 80 is formed on the side 20*a* of the semiconductor layer 20, a pinch-off failure which occurs in the semiconductor device 100 is improved (portion Q2 of FIG. 6B). With the semiconductor device 1, the disappearance of the insulating film 80 at the time of performing dry etching on the protection film 70 and the exposure of the peak portion 90 and the channel layer 21 and the disappearance of the peak portion 90 caused by the disappearance of the insulating film 80 are effectively suppressed. This suppresses contact between the channel layer 21 and the gate electrode 30 and a short circuit between the channel layer 21 and the gate electrode 30 caused by contact between the channel layer 21 and the gate electrode 30. As a result, the occurrence of a pinch-off failure is suppressed.

In the first embodiment the semiconductor device 1 including the substrate 10 and the semiconductor layer 20 formed by the use of an InP-based material is taken as an example. Furthermore, with a semiconductor device in which the substrate 10 and the semiconductor layer 20 are formed by the use of another semiconductor material, such as gallium nitride (GaN)-based material, the same applies. That is to say, the above effect is obtained by covering a side 20*a* of a semiconductor layer 20 formed by locating an element isolation region 60 with an insulating film 80.

Furthermore, in the first embodiment an example in which the insulating film 80 containing a metal element is located between the side 20*a* of the semiconductor layer 20 and the gate electrode 30 formed on the side of the side 20*a* to suppress a short circuit on the side 20*a* between the channel layer 21 and the gate electrode 30 is given. In addition, a case where a second conductive material, such as a source electrode 40 or a drain electrode 50, is formed on the side of the side 20*a* of the semiconductor layer 20, a short circuit between the second conductive material and the side 20*a* of the semiconductor layer 20 is suppressed in the same way by an insulating film 80 located between the second conductive material and the side 20*a* of the semiconductor layer 20.

Second Embodiment

Figure 7A:
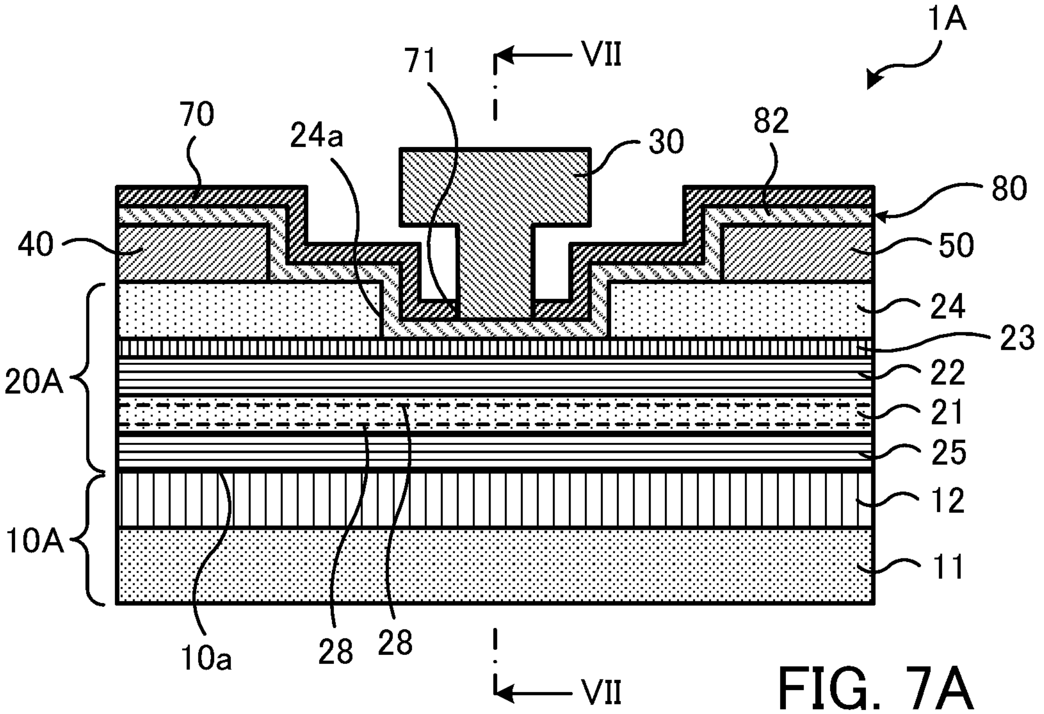
FIGS. 7A and 7B are views for describing an example of a semiconductor device according to a second embodiment.
Figure 7B:
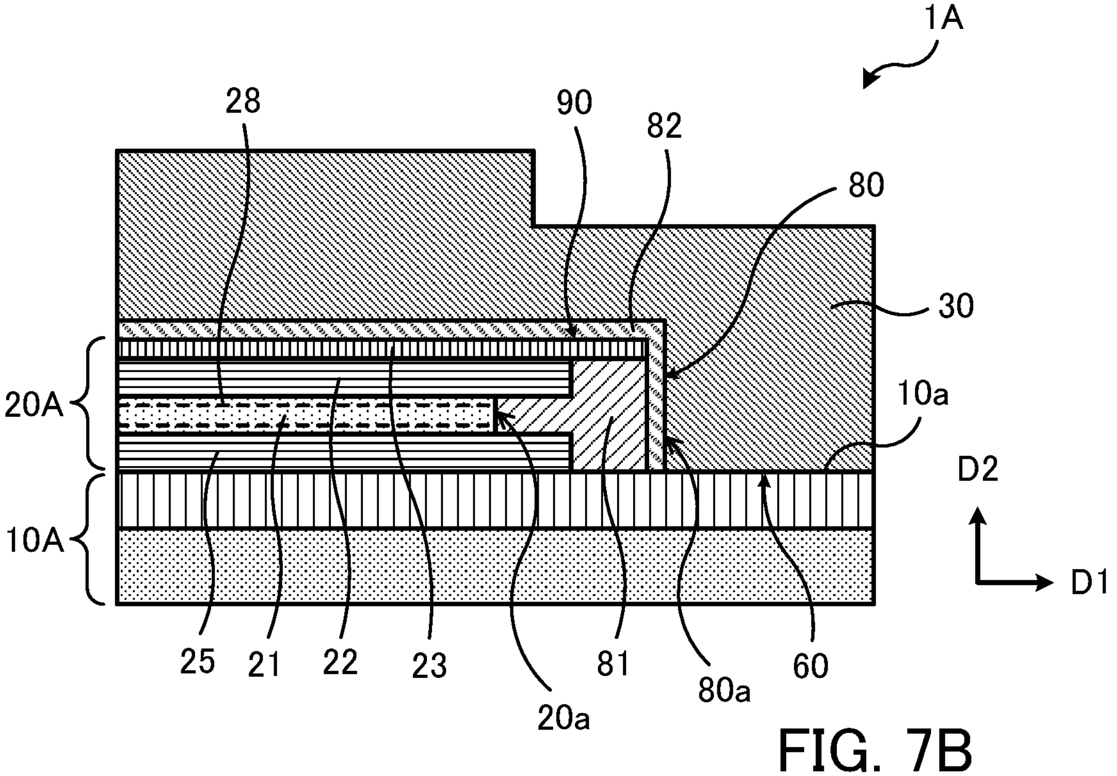

FIGS. 7A and 7B are views for describing an example of a semiconductor device according to a second embodiment. Each of FIGS. 7A and 7B is a fragmentary schematic sectional view of an example of a semiconductor device. FIG. 7B is an example of a schematic sectional view taken along the line VII-VII of FIG. 7A.

As illustrated in FIG. 7A, a semiconductor device 1A includes a substrate 10A, a semiconductor layer 20A, a gate electrode 30, a source electrode 40, a drain electrode 50, a protection film 70, and an insulating film 80. The semiconductor device 1A is an example of an HEMT.

The substrate 10A includes a foundation substrate 11 and a buffer layer 12. The buffer layer 12 is formed over the foundation substrate 11. For example, an InP substrate is used as the foundation substrate 11. The buffer layer 12 is formed by the use of, for example, InAlAs. For example, the thickness of the buffer layer 12 is set in the range of about 200 to 300 nm.

The semiconductor layer 20A is formed over a surface 10*a* of the substrate 10A on the side of the buffer layer 12. The semiconductor layer 20A has a structure in which a carrier supply layer 25, a channel layer 21 and a carrier supply layer 22 (layer including the channel layer 21 and the carrier supply layer 22 is also referred to as a first layer), an etching stop layer 23 (also referred to as a second layer), and a cap layer 24 are laminated in order from the side of the surface 10*a* of the substrate 10A. The carrier supply layer 25, the channel layer 21, the carrier supply layer 22, the etching stop layer 23, and the cap layer 24 are formed by the use of a compound semiconductor material. The carrier supply layer 25 is formed by the use of, for example, InAlAs. The channel layer 21 is formed by the use of, for example, InGaAs. The carrier supply layer 22 is formed by the use of, for example, InAlAs. The etching stop layer 23 is formed by the use of, for example, InP or InGaP. The cap layer 24 is formed by the use of, for example, InGaAs. A recess 24*a* which communicates with the etching stop layer 23 is formed in the cap layer 24. Two-dimensional carrier gas 28 is generated in the channel layer 21 near an interface between the channel layer 21 and the carrier supply layer 25 and an interface between the channel layer 21 and the carrier supply layer 22.

The thickness of the carrier supply layer 25 is set in the range of, for example, about 2 to 25 nm. The thickness of the channel layer 21 is set in the range of, for example, about 9 to 25 nm. The thickness of the carrier supply layer 22 is set in the range of, for example, about 9 to 25 nm. The thickness of the etching stop layer 23 is set in the range of, for example, about 4 to 6 nm. The thickness of the cap layer 24 is set in the range of, for example, about 30 to 50 nm. For example, each of the carrier supply layer 25, the carrier supply layer 22, and the cap layer 24 is doped with impurities, such as Si, in a determined region at a determined concentration.

As illustrated in FIG. 7A, the source electrode 40 and the drain electrode 50 are formed over the cap layer 24. The source electrode 40 and the drain electrode 50 are separated from each other and are located in positions opposite each other with the recess 24*a* of the cap layer 24 therebetween. Each of the source electrode 40 and the drain electrode 50 is made of Ti, Pt, and Au. For example, each of the source electrode 40 and the drain electrode 50 has a structure in which a Ti layer, a Pt layer, and an Au layer are laminated in order. The source electrode 40 and the drain electrode 50 are located so as to function as an ohmic electrode.

As illustrated in FIG. 7A, the protection film 70 is formed so as to cover the semiconductor layer 20A on the opposite side of the substrate 10A. The protection film 70 is formed so as to cover the cap layer 24, the etching stop layer 23 in the recess 24$a$ of the cap layer 24, and the source electrode 40 and the drain electrode 50 over the cap layer 24. For example, SiN is used as the protection film 70. An opening portion 71 is formed in the protection film 70 so as to be situated in the recess 24$a$ of the cap layer 24.

As illustrated in FIG. 7A, the gate electrode 30 is formed between the source electrode 40 and the drain electrode 50 so as to be situated in the opening portion 71 of the protection film 70 formed in the recess 24$a$ of the cap layer 24. The gate electrode 30 is separated from the source electrode 40 and the drain electrode 50. The gate electrode 30 is made of Ti, Pt, and Au. For example, the gate electrode 30 has a structure in which a Ti layer, a Pt layer, and an Au layer are laminated in order. For example, the gate electrode 30 is formed over the semiconductor layer 20A on the opposite side of the substrate 10A so as to have a section in the shape of the letter "T".

As illustrated in FIG. 7A, the insulating film 80 is formed so as to cover the cap layer 24, the etching stop layer 23 in the recess 24$a$ of the cap layer 24, and the source electrode 40 and the drain electrode 50 over the cap layer 24. The insulating film 80 is formed between the semiconductor layer 20A and the protection film 70 over the semiconductor layer 20A on the opposite side of the substrate 10A. The opening portion 71 of the protection film 70 is formed so as to communicate with the insulating film 80. A lower end of the gate electrode 30 formed in the opening portion 71 of the protection film 70 is in contact with the insulating film 80. The gate electrode 30 is formed over the semiconductor layer 20A with the insulating film 80 therebetween. The insulating film 80 intervening between the gate electrode 30 and the semiconductor layer 20A (etching stop layer 23 of the semiconductor layer 20A) functions as a gate insulating film. The semiconductor device 1A is an example of an HEMT having a metal insulator semiconductor (MIS)-type gate structure. For example, $Al_2O_3$ is used as the insulating film 80.

An insulating film containing a metal element having an electronegativity of 1.8 or less is used as the insulating film 80. An insulating film containing one or more of metal elements, such as Al, Hf, Zr, Ti, Ta, Mg, Sc, Y, La, and Sr, is used as the insulating film 80. A laminated structure of one or more of an oxide film, a nitride film, and an oxynitride film each containing such a metal element may be used as the insulating film 80.

With the semiconductor device 1A having the structure illustrated in FIG. 7A, isolation is performed by making the semiconductor layer 20A a mesa. FIG. 7B illustrates an example of the structure of a portion near an element isolation region 60 formed at the end of the semiconductor layer 20A in the direction of the depth of the paper surface by making the semiconductor layer 20A included in the semiconductor device 1A illustrated in FIG. 7A a mesa.

As illustrated in FIG. 7B, for example, in section along a position in which the gate electrode 30 is formed, a side of the carrier supply layer 25, a side of the channel layer 21, a side of the carrier supply layer 22, and a side of the etching stop layer 23 are situated on a side 20$a$ of the semiconductor layer 20A on the element isolation region 60. For example, the etching stop layer 23 has a shape which is such that the etching stop layer 23 extrudes outward from the side of the carrier supply layer 22 formed thereunder. The carrier supply layer 22 has a shape which is such that the carrier supply layer 22 extrudes outward from the side of the channel layer 21 formed thereunder. The carrier supply layer 25 has a shape which is such that the carrier supply layer 25 extrudes outward from the side of the channel layer 21 formed thereover. A peak portion 90 including the etching stop layer 23 and the carrier supply layer 22 and extruding outward from the side of the channel layer 21 is located over the channel layer 21. The shape of such a level difference on the side 20$a$ of the semiconductor layer 20A is realized by etching performed at the time of forming the element isolation region 60.

As illustrated in FIG. 7A, the insulating film 80 is formed over the semiconductor layer 20A on the opposite side of the substrate 10A so as to cover the cap layer 24, the etching stop layer 23 in the recess 24$a$ of the cap layer 24, and the source electrode 40 and the drain electrode 50 over the cap layer 24. Furthermore, as illustrated in FIG. 7B, the insulating film 80 is formed so as to extend from over the semiconductor layer 20A to the side 20$a$ of the semiconductor layer 20A (element isolation region 60) and cover on the side 20$a$ the peak portion 90 including the etching stop layer 23 and the carrier supply layer 22, the channel layer 21, and the carrier supply layer 25.

As illustrated in FIG. 7B, the insulating film 80 has a structure in which a first insulating portion 81 and a second insulating portion 82 are partially laminated. The first insulating portion 81 covers on the side 20$a$ of the semiconductor layer 20A the side of the carrier supply layer 22, the side of the channel layer 21, and the side of the carrier supply layer 25 under the etching stop layer 23. The second insulating portion 82 covers the cap layer 24 of the semiconductor layer 20A, the etching stop layer 23 in the recess 24$a$ of the cap layer 24, and the source electrode 40 and the drain electrode 50 over the cap layer 24 on the opposite side of the substrate 10A and covers the first insulating portion 81 on the side 20$a$ on the opposite side of the substrate 10A. The first insulating portion 81 and the second insulating portion 82 are formed on the side 20$a$ of the semiconductor layer 20A under the etching stop layer 23 and the second insulating portion 82 is formed on the side 20$a$ of the semiconductor layer 20A at the side of the etching stop layer 23. As a result, with the insulating film 80 formed on the side 20$a$ of the semiconductor layer 20A, the thickness in the direction D1 of a portion under the etching stop layer 23 is more than the thickness in the direction D1 of a portion at the side of the etching stop layer 23. Materials used for forming the first insulating portion 81 and the second insulating portion 82 may be the same or different from each other.

The protection film 70 having the opening portion 71 which communicates with the insulating film 80 (second insulating portion 82 of the insulating film 80) is formed over the insulating film 80 including the first insulating portion 81 and the second insulating portion 82 (FIG. 7A) and the gate electrode 30 is formed in the opening portion 71 of the protection film 70. As illustrated in FIG. 7B, the gate electrode 30 is formed so as to extend from over the semiconductor layer 20A (from the opening portion 71 of the protection film 70) to the element isolation region 60 on the side of the side 20$a$ of the semiconductor layer 20A. As illustrated in FIG. 7B, part of the insulating film 80, that is to say, a portion of the insulating film 80 in which the first insulating portion 81 and the second insulating portion 82 are laminated are formed between the side 20$a$ of the semiconductor layer 20A and the gate electrode 30 formed so as to extend to the side of the side 20$a$ of the semiconductor layer 20A.

A method for manufacturing the semiconductor device 1A having the above structure will now be described.

FIG. 8A through FIG. 14B are views for describing an example of a method for manufacturing the semiconductor device according to the second embodiment. Each process for manufacturing the semiconductor device will now be described in order by reference to FIG. 8A through FIG. 14B and FIGS. 7A and 7B.

Figure 8A:
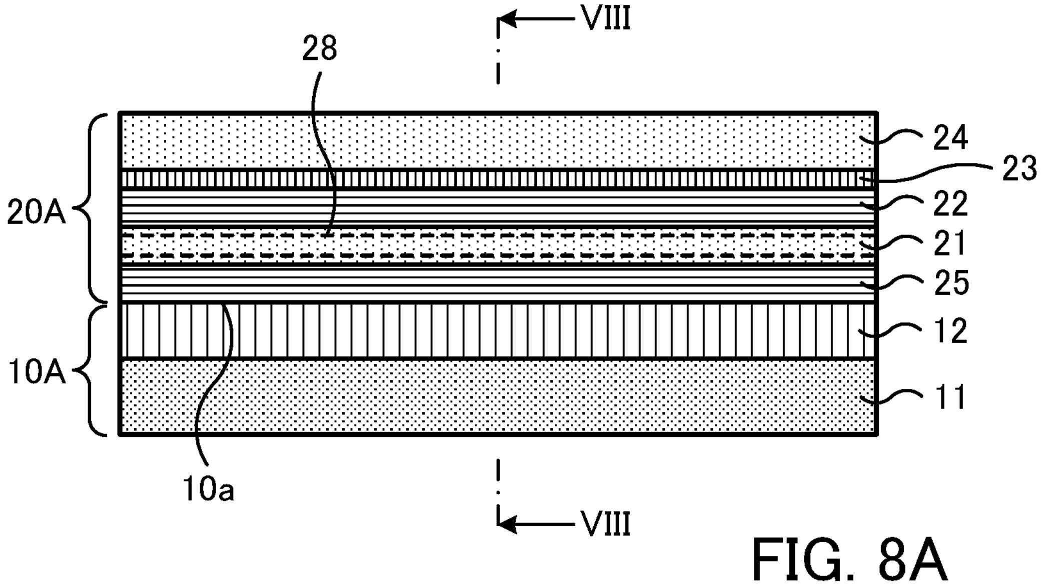
FIGS. 8A and 8B are views for describing an example of a method for manufacturing the semiconductor device according to the second embodiment (part 1)
Figure 8B:
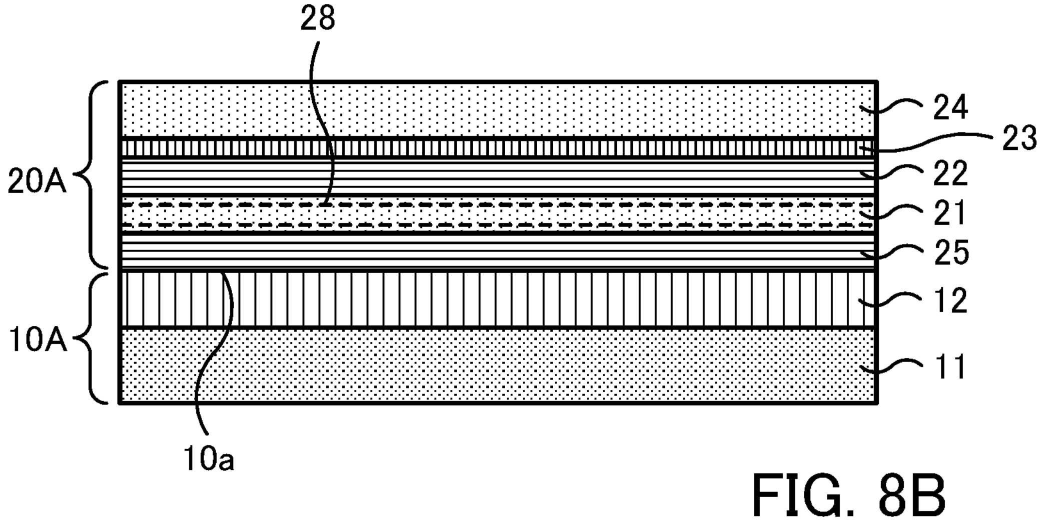

Each of FIGS. 8A and 8B is a fragmentary schematic sectional view of an example of a semiconductor layer formation process. FIG. 8B is an example of a schematic sectional view taken along the line VIII-VIII of FIG. 8A.

First the substrate 10A and the semiconductor layer 20A illustrated in FIG. 8A and FIG. 8B are formed. First the foundation substrate 11, such as an InP substrate, is prepared. The buffer layer 12, such as InAlAs, is formed by the use of, for example, a metal organic chemical vapor deposition (MOCVD) method over the prepared foundation substrate 11. By doing so, the substrate 10A is formed.

Next, the carrier supply layer 25, the channel layer 21, the carrier supply layer 22, the etching stop layer 23, and the cap layer 24 are formed in order by the use of, for example, the MOCVD method over the buffer layer 12 of the substrate 10A. At this time the carrier supply layer 25 over the buffer layer 12 is formed by, for example, the introduction of impurities such as delta doping (atomic layer doping). Doping of impurities, such as Si, is performed at a rate of about $2\times10^{12}$ $cm^{-2}$. An interface between the buffer layer 12 and the carrier supply layer 25 is doped with impurities in sheet form. A doping interface is at a depth of about 3 to 5 nm from the surface of the carrier supply layer 25. In this case, a portion of the carrier supply layer 25 on the surface side from the doping interface may be considered as a spacer layer. After the carrier supply layer 25 is formed, the channel layer 21, the carrier supply layer 22, the etching stop layer 23, and the cap layer 24 are formed in order over the carrier supply layer 25. As a result, the semiconductor layer 20A is formed.

After the semiconductor layer 20A is formed, the element isolation region 60 is formed.

Figure 9A:
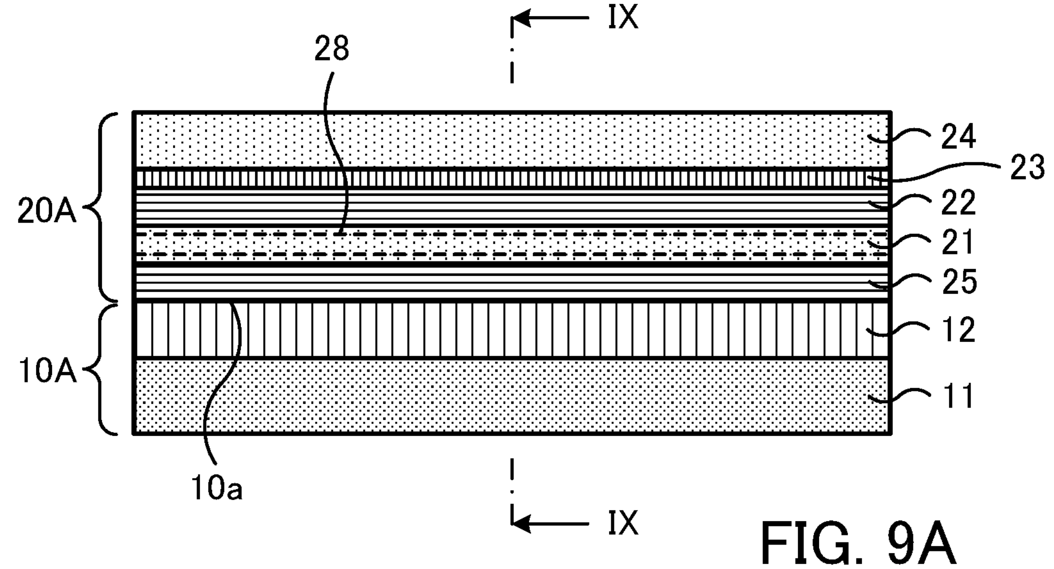
FIGS. 9A and 9B are views for describing an example of a method for manufacturing the semiconductor device according to the second embodiment (part 2)
Figure 9B:
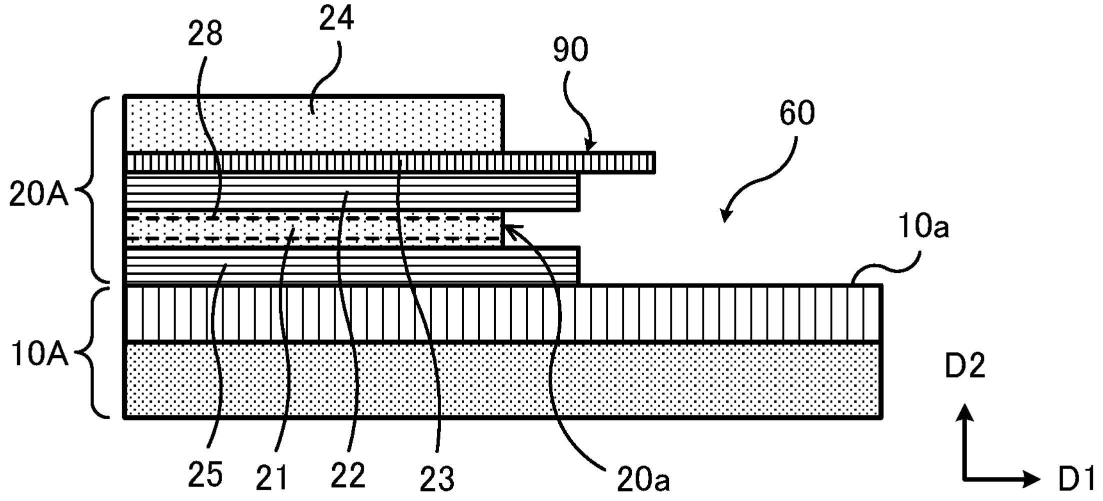

Each of FIGS. 9A and 9B is a fragmentary schematic sectional view of an example of an element isolation region formation process (process for making a semiconductor layer a mesa). FIG. 9B is an example of a schematic sectional view taken along the line IX-IX of FIG. 9A.

For example, the element isolation region 60 is formed in the following way. A resist mask (not illustrated) having an opening over an area in which the element isolation region 60 is to be formed is formed over the cap layer 24 and the cap layer 24 is etched by the use of, for example, a liquid mixture of phosphoric acid and a hydrogen peroxide solution. This etching is stopped at the surface of the etching stop layer 23. Next, the etching stop layer 23 is etched by the use of, for example, hydrochloric acid. This etching is stopped at the surface of the carrier supply layer 22. After that, the carrier supply layer 22, the channel layer 21, and the carrier supply layer 25 are etched by the use of, for example, a liquid mixture of phosphoric acid and a hydrogen peroxide solution. The element isolation region 60 is formed in this way. After the element isolation region 60 is formed, the resist mask is removed. As illustrated in FIG. 9B, by forming the element isolation region 60 by the above etching, the etching stop layer 23, the carrier supply layer 22, and the carrier supply layer 25 form a shape which is such that the etching stop layer 23, the carrier supply layer 22, and the carrier supply layer 25 extrude outward from the channel layer 21. The etching stop layer 23 forms a shape which is such that the etching stop layer 23 extrudes outward from the carrier supply layer 22 and the carrier supply layer 25. A peak portion 90 including the etching stop layer 23 and the carrier supply layer 22 and extruding outward from the side of the channel layer 21 is formed over the channel layer 21. By forming the element isolation region 60, the semiconductor layer 20A is made a mesa and isolation is performed. By forming the element isolation region 60, the side 20*a* which has the shape of a level difference and which faces the direction D1 parallel to the surface 10*a* of the substrate 10A is formed on the semiconductor layer 20A.

After the element isolation region 60 is formed, the first insulating portion 81 of the insulating film 80 is formed.

Figure 10A:
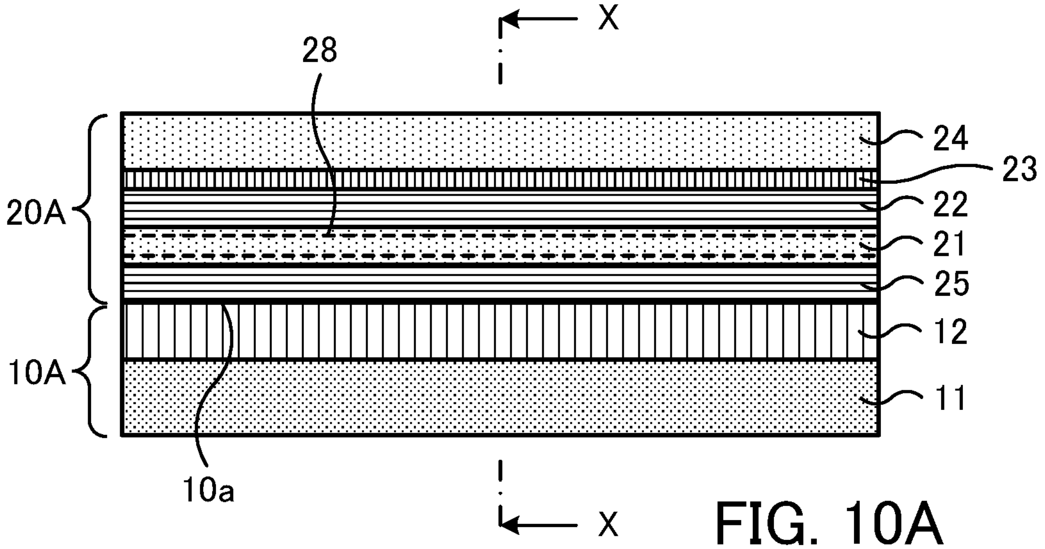
FIGS. 10A and 10B are views for describing an example of a method for manufacturing the semiconductor device according to the second embodiment (part 3)
Figure 10B:
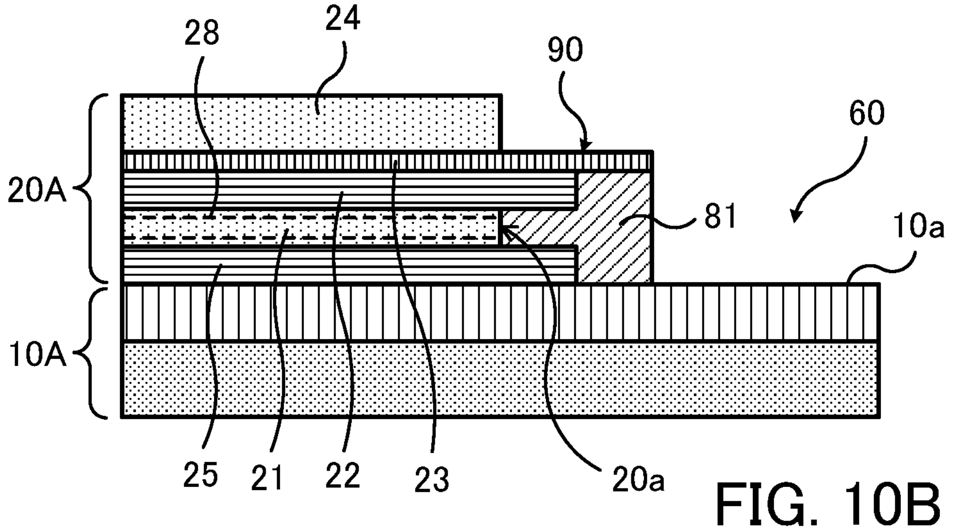

Each of FIGS. 10A and 10B is a fragmentary schematic sectional view of an example of a first insulating portion formation process. FIG. 10B is an example of a schematic sectional view taken along the line X-X of FIG. 10A.

First an insulating material, such as $Al_2O_3$, for the first insulating portion 81 is formed so as to cover the semiconductor layer 20A made a mesa by forming the element isolation region 60. $Al_2O_3$, which is an insulating material, is formed by the use of, for example, an atomic layer deposition (ALD) method. It is desirable to set the thickness of $Al_2O_3$ in the range of 2 to 50 nm. For example, the thickness of $Al_2O_3$ is set to 10 nm. With the ALD method $Al_2O_3$ is formed with good coverage on the side 20*a* of the semiconductor layer 20A having the level difference. After $Al_2O_3$ which covers the semiconductor layer 20A is formed, a resist mask (not illustrated) having an opening extending upward from the etching stop layer 23 of the semiconductor layer 20A is formed. By performing wet etching using an alkali-based liquid medicine, $Al_2O_3$ is selectively removed from over the etching stop layer 23. As a result, a structure in which a side of a portion under the etching stop layer 23 of the semiconductor layer 20A, that is to say, the side of the carrier supply layer 22, the side of the channel layer 21, and the side of the carrier supply layer 25 are covered with $Al_2O_3$ is obtained. The first insulating portion 81 is formed of that $Al_2O_3$.

After the first insulating portion 81 is formed, the source electrode 40, the drain electrode 50, and the recess 24*a* of the cap layer 24 are formed.

Figure 11A:
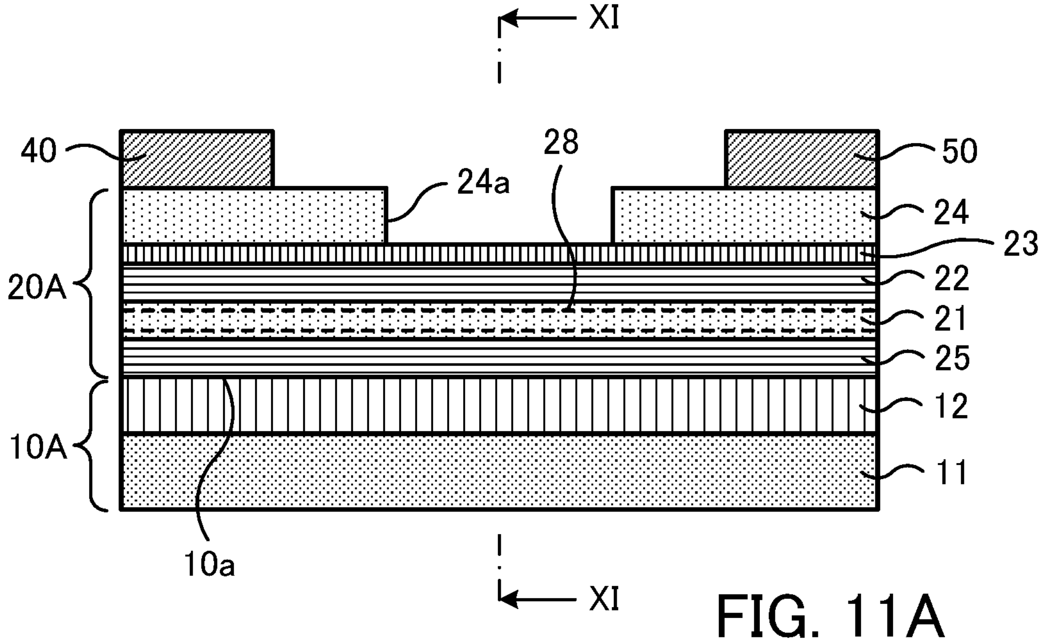
FIGS. 11A and 11B are views for describing an example of a method for manufacturing the semiconductor device according to the second embodiment (part 4)
Figure 11B:
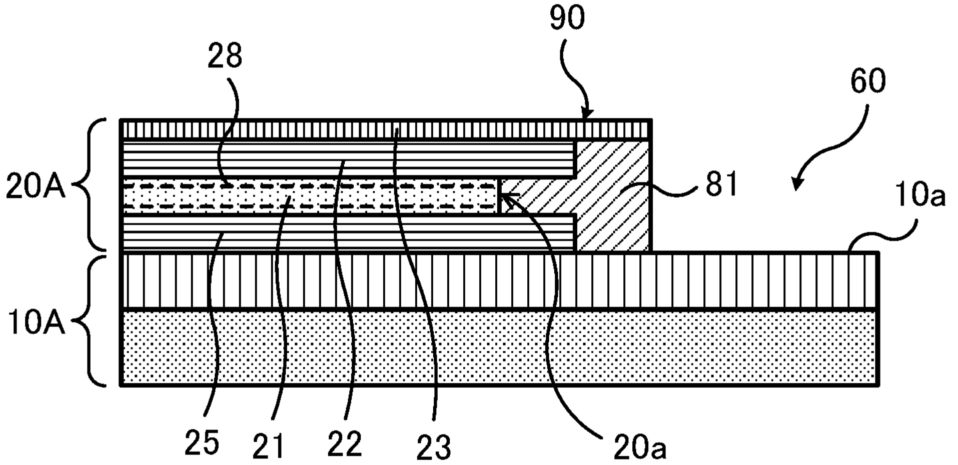

Each of FIGS. 11A and 11B is a fragmentary schematic sectional view of an example of a source electrode, drain electrode and recess formation process. FIG. 11B is an example of a schematic sectional view taken along the line XI-XI of FIG. 11A.

First the source electrode 40 and the drain electrode 50 are formed over the semiconductor layer 20A demarcated by the element isolation region 60. At that time, a resist mask (not illustrated) having an opening over an area in which the source electrode 40 or the drain electrode 50 is to be formed is formed over the cap layer 24 and Ti, Pt, and Au are formed in order by the use of an evaporation method. Furthermore, the resist mask, together with Ti, Pt, and Au formed thereover, is removed. The source electrode 40 and the drain electrode 50 are formed over the cap layer 24 by the use of, for example, this lift-off method.

Next, the recess 24*a* is formed in an area of the cap layer 24 between the source electrode 40 and the drain electrode 50. At that time, a resist mask (not illustrated) having an opening over the area in which the recess 24*a* is to be formed is formed over the cap layer 24 and the cap layer 24 is etched by the use of, for example, a liquid mixture of phosphoric acid and a hydrogen peroxide solution. This etching is stopped at the surface of the etching stop layer 23. The recess 24*a* is formed in the cap layer 24 by the use of this method.

After the source electrode 40 and the drain electrode 50 are formed and the recess 24*a* is formed in the cap layer 24, the second insulating portion 82 of the insulating film 80 is formed.

Figure 12A:
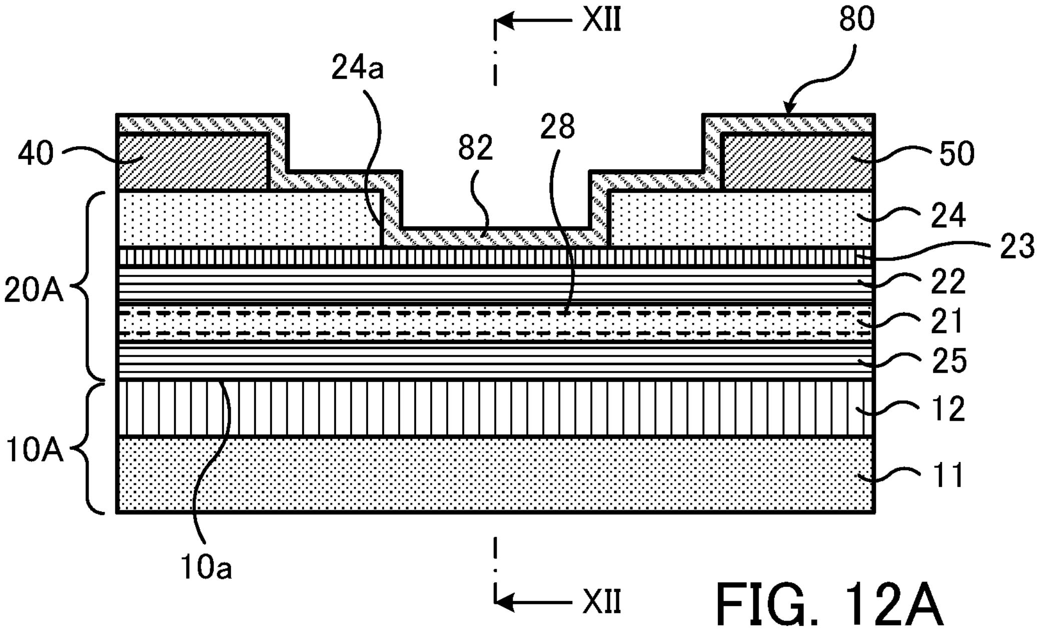
FIGS. 12A and 12B are views for describing an example of a method for manufacturing the semiconductor device according to the second embodiment (part 5)
Figure 12B:
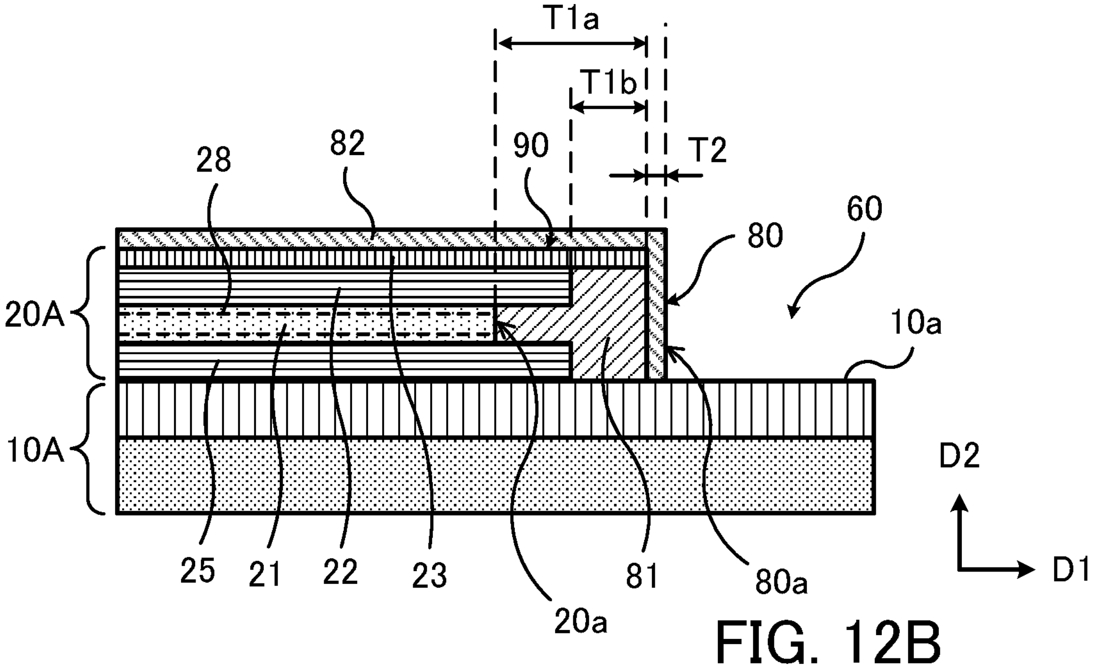

Each of FIGS. 12A and 12B is a fragmentary schematic sectional view of an example of a second insulating portion formation process. FIG. 12B is an example of a schematic sectional view taken along the line XII-XII of FIG. 12A.

An insulating material, such as $Al_2O_3$, for the second insulating portion 82 is formed so as to cover the cap layer 24, the etching stop layer 23 in the recess 24*a* of the cap layer 24, the source electrode 40 and the drain electrode 50 over the cap layer 24, and the first insulating portion 81 formed on the side 20*a* of the semiconductor layer 20A. $Al_2O_3$, which is an insulating material, is formed by the use of, for example, the ALD method. It is desirable to set the thickness of $Al_2O_3$ in the range of 1 to 10 nm. For example, the thickness of $Al_2O_3$ is set to 2 nm. The second insulating portion 82 is formed of this $Al_2O_3$. A portion of the second insulating portion 82 formed over the etching stop layer 23 functions as a gate insulating film.

A portion, that is to say, the carrier supply layer 22, the channel layer 21, and the carrier supply layer 25 under the etching stop layer 23 on the side 20*a* of the semiconductor layer 20A are covered with a laminated structure of the second insulating portion 82 formed in this step and the first insulating portion 81 formed in the above step. After the first insulating portion 81 is formed, the second insulating portion 82 is formed in this way. By doing so, the insulating film 80 including the first insulating portion 81 and the second insulating portion 82 is formed.

The first insulating portion 81 and the second insulating portion 82 (also referred to as a first part) included in the insulating film 80 are formed on the side 20*a* of the semiconductor layer 20A under the etching stop layer 23 and the second insulating portion 82 (also referred to as a second part) included in the insulating film 80 is formed on the side 20*a* of the semiconductor layer 20A at the side of the etching stop layer 23. Accordingly, with the insulating film 80 formed on the side 20*a* of the semiconductor layer 20A, the thickness T1a or T1b (also referred to as a first thickness) in the direction D1 of a portion under the etching stop layer 23 is more than the thickness T2 (also referred to as a second thickness) in the direction D1 of a portion at the side of the etching stop layer 23.

After the second insulating portion 82 (insulating film 80 including the second insulating portion 82) is formed, the protection film 70 is formed.

Figure 13A:
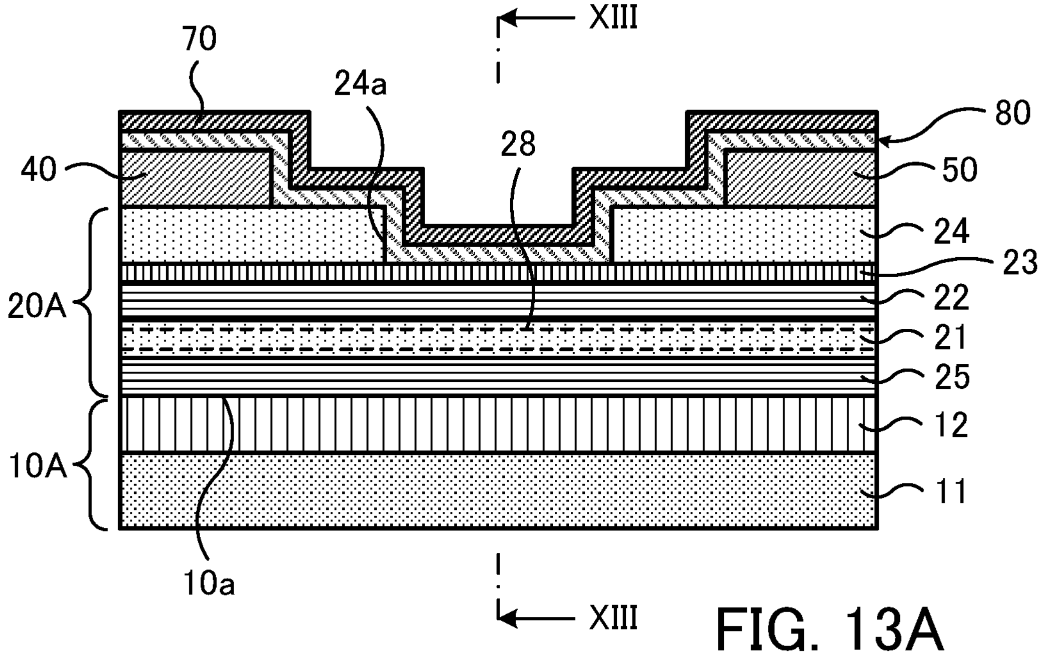
FIGS. 13A and 13B are views for describing an example of a method for manufacturing the semiconductor device according to the second embodiment (part 6)
Figure 13B:
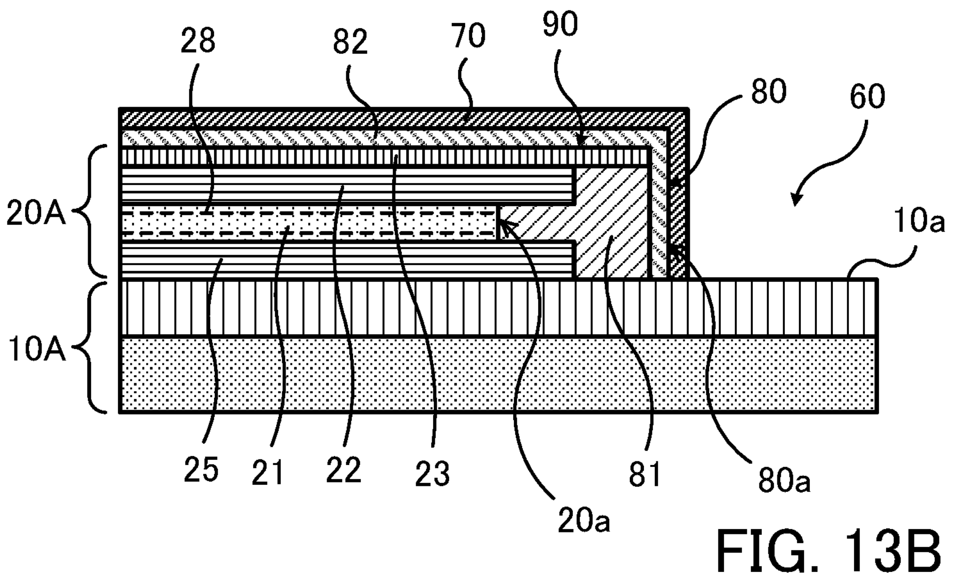

Each of FIGS. 13A and 13B is a fragmentary schematic sectional view of an example of a protection film formation process. FIG. 13B is an example of a schematic sectional view taken along the line XIII-XIII of FIG. 13A.

The protection film 70 made of SiN or the like is formed so as to cover the semiconductor layer 20A covered with the insulating film 80. The protection film 70 is formed by the use of, for example, a plasma CVD method. The protection film 70 made of SiN or the like and having a thickness in the range of 2 to 500 nm is formed. The protection film 70 may be formed by the use of the ALD method, a sputtering method, or the like in place of the plasma CVD method. The protection film 70 is formed so as to cover the insulating film 80 formed so as to cover the cap layer 24, the etching stop layer 23 in the recess 24*a* of the cap layer 24, the source electrode 40 and the drain electrode 50 over the cap layer 24, and the semiconductor layer 20A.

After the protection film 70 is formed, the opening portion 71 is formed in the protection film 70.

Figure 14A:
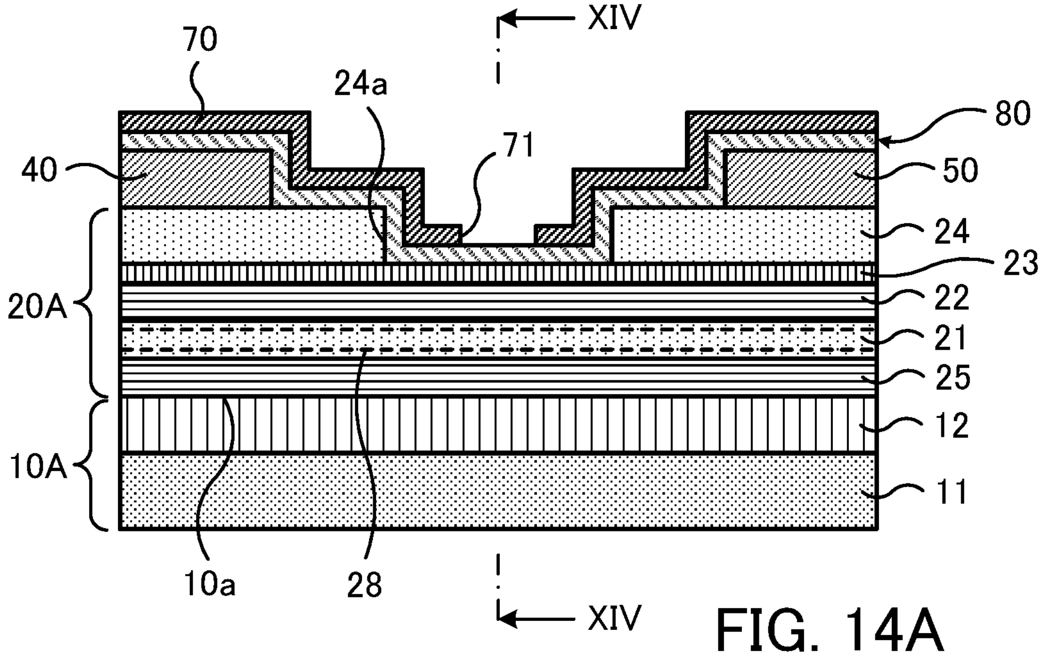
FIGS. 14A and 14B are views for describing an example of a method for manufacturing the semiconductor device according to the second embodiment (part 7)
Figure 14B:
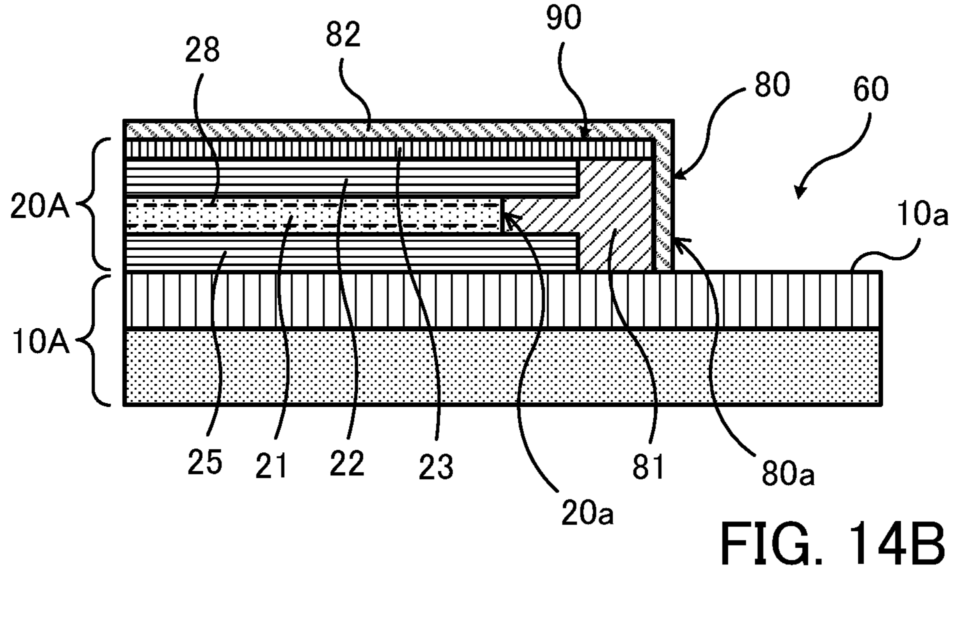

Each of FIGS. 14A and 14B is a fragmentary schematic sectional view of an example of an opening portion formation process. FIG. 14B is an example of a schematic sectional view taken along the line XIV-XIV of FIG. 14A.

The opening portion 71 which is situated in the recess 24*a* of the cap layer 24 is formed in the protection film 70 by dry etching using, for example, fluorine-based gas. At that time, first a resist mask (not illustrated) having an opening over an area in the recess 24*a* in which the opening portion 71 is to be formed is formed and dry etching is performed by the use of fluorine-based gas. The opening portion 71 is formed in the protection film 70 in the recess 24*a* by this dry etching.

As illustrated in FIG. 14B, the protection film 70 formed on a side 80*a* of the insulating film 80 may be removed when this dry etching is performed. In this case, the side 80*a* of the insulating film 80 becomes an exposed state after the opening portion 71 is formed by dry etching.

After the opening portion 71 is formed in the protection film 70, the gate electrode 30 is formed. The gate electrode 30 is formed so as to be situated in the opening portion 71 formed in the protection film 70 and extend from over the semiconductor layer 20A (from the opening portion 71 of the protection film 70) to the element isolation region 60 on the side of the side 20*a* of the semiconductor layer 20A. By doing so, the semiconductor device 1A illustrated in FIG. 7A and FIG. 7B is manufactured.

As stated above, when the semiconductor device 1A is manufactured, dry etching is performed by the use of fluorine-based gas on the protection film 70 (FIGS. 13A and 13B) formed so as to cover the insulating film 80. By doing so, the opening portion 71 is formed (FIGS. 14A and 14B). After that, the gate electrode 30 is formed in the opening portion 71 (FIGS. 7A and 7B).

The side 20*a* of the semiconductor layer 20A is covered with the insulating film 80 and is not exposed. This suppresses exposure to fluorine-based gas when the opening portion 71 is formed in the protection film 70 by dry etching. When the protection film 70 is formed so as to cover the insulating film 80, the protection film 70 is formed on the side 80*a* of the insulating film 80. Even if the protection film 70 on the side 80*a* of the insulating film 80 is removed by dry etching, the side 20*a* of the semiconductor layer 20A is covered with the insulating film 80. This suppresses the exposure of the side 20*a* of the semiconductor layer 20A to fluorine-based gas. As stated above, a material, such as $Al_2O_3$, having high etching resistance to fluorine-based gas is used for forming the insulating film 80. This suppresses the disappearance of the insulating film 80 exposed to fluorine-based gas. As a result, the exposure of the side 20*a* of the semiconductor layer 20A to fluorine-based gas is suppressed.

Accordingly, the disappearance of part of the side 20*a* of the semiconductor layer 20A is suppressed. For example, the disappearance of the etching stop layer 23 included in the peak portion 90 or the etching stop layer 23 and the carrier supply layer 22 included in the peak portion 90 is suppressed. Furthermore, because the side 20*a* of the semiconductor layer 20A is covered with the insulating film 80, contact between the gate electrode 30 formed after the formation of the opening portion 71 in the protection film 70 by dry etching and the channel layer 21 on the side 20*a* of the semiconductor layer 20A is suppressed. With the semiconductor device 1A contact between the gate electrode 30 and the channel layer 21 on the side 20*a* of the semiconductor layer 20A is suppressed this way. Accordingly, a short circuit between the gate electrode 30 and the channel layer 21, that is to say, between the two-dimensional carrier gas 28 generated in the channel layer 21 and the gate electrode 30 is suppressed. As a result, deterioration in the performance of the semiconductor device 1A caused by a short circuit between the gate electrode 30 and the channel layer 21 is suppressed.

With the semiconductor device 1A the side 20*a* of the semiconductor layer 20A is covered with the insulating film 80. This suppresses the exposure of the side 20*a* of the semiconductor layer 20A to fluorine-based gas. Accordingly, the disappearance of the peak portion 90 formed on the side 20*a* of the semiconductor layer 20A which is caused by exposure to fluorine-based gas is suppressed. Because the disappearance of the peak portion 90 is suppressed, there is no need to set the thickness of the peak portion 90 to thickness which is such that the peak portion 90 may resist disappearance caused by dry etching. For example, the thickness of the etching stop layer 23 included in the peak portion 90 may be set to thickness which is such that etching performed at the time of forming the recess 24*a* of the cap layer 24 may be stopped. For example, the thickness of the etching stop layer 23 may be set to 5 nm or less. A decrease in the thickness of the etching stop layer 23 suppresses an increase in the distance between the gate electrode 30 and the channel layer 21 with the etching stop layer 23 and the carrier supply layer 22 therebetween and suppresses a decrease in the strength of an electric field applied from the gate electrode 30 to the channel layer 21. As a result, deterioration in the high-frequency characteristic of the semiconductor device 1A is suppressed. In order to suppress an increase in the distance between the gate electrode 30 and the channel layer 21 with the etching stop layer 23 and the carrier supply layer 22 therebetween, it is desirable to set the thickness of the etching stop layer 23 to half or less of the thickness in the direction D2 of the channel layer 21.

Third Embodiment

Figure 15A:
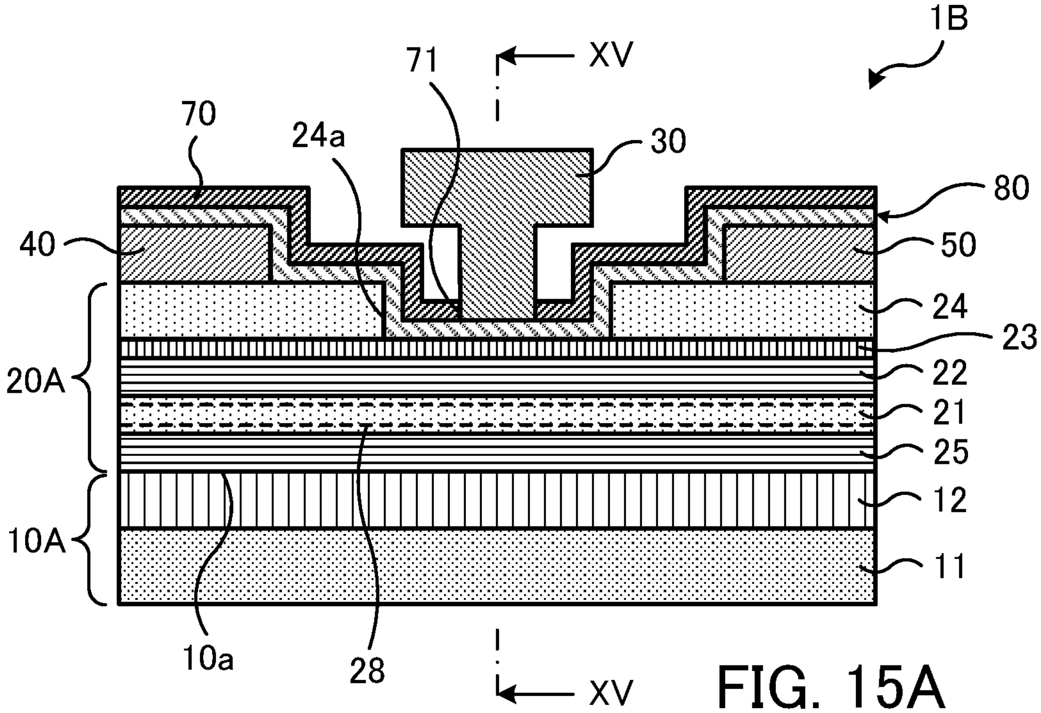
FIGS. 15A and 15B are views for describing an example of a semiconductor device according to a third embodiment.
Figure 15B:
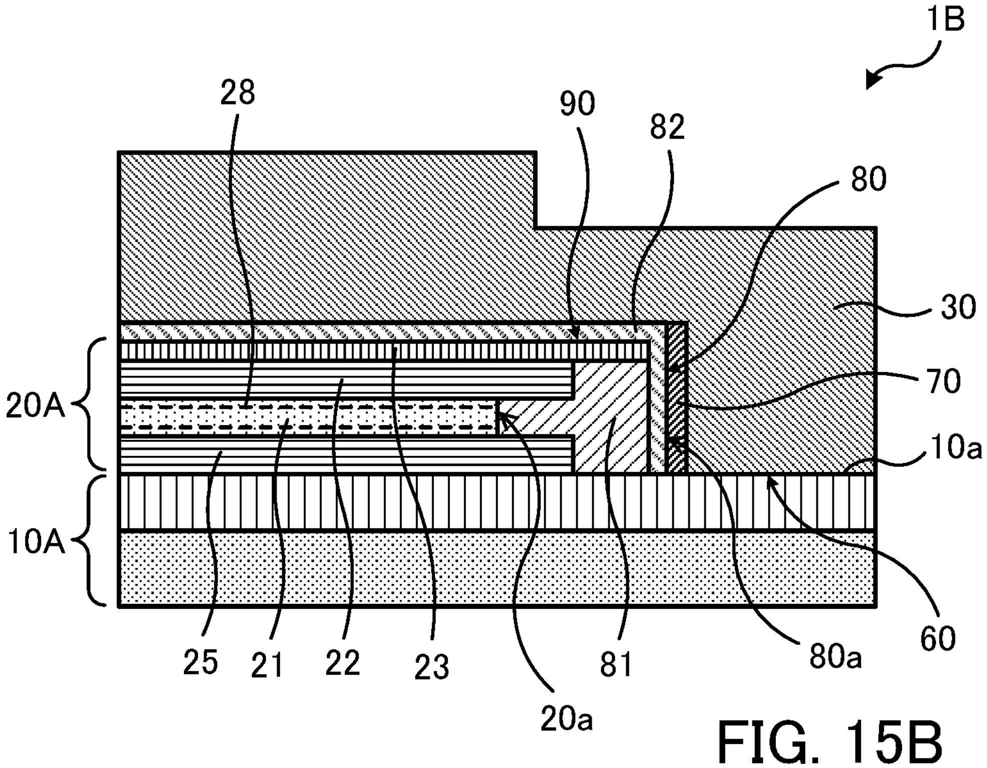

FIGS. 15A and 15B are views for describing an example of a semiconductor device according to a third embodiment. Each of FIGS. 15A and 15B is a fragmentary schematic sectional view of an example of a semiconductor device. FIG. 15B is an example of a schematic sectional view taken along the line XV-XV of FIG. 15A.

A semiconductor device 1B illustrated in FIGS. 15A and 15B has a structure in which a protection film 70 is left on a side 80*a* of an insulating film 80. The semiconductor device 1B differs from the semiconductor device 1A described in the above second embodiment in that it has the above structure.

With the semiconductor device 1B the protection film 70 formed over a semiconductor layer 20A on the opposite side of a substrate 10A extends to the side of a side 20*a* of the semiconductor layer 20A and is left on the side 80*a* of the insulating film 80 which covers the side 20*a* of the semiconductor layer 20A. The protection film 70 left on the side 80*a* of the insulating film 80 is situated between the insulating film 80 which covers the side 20*a* of the semiconductor layer 20A and a gate electrode 30 formed on the side of the side 20*a* of the semiconductor layer 20A.

As illustrated in FIG. 15B, with the semiconductor device 1B a channel layer 21 is separated from the gate electrode 30 by the insulating film 80 which covers the channel layer 21 and the protection film 70 left on the side 80*a* of the insulating film 80. This suppresses contact between the channel layer 21 and the gate electrode 30 and a short circuit between the channel layer 21 and the gate electrode 30 caused by contact between them. Because the protection film 70 is left on the side 80*a* of the insulating film 80, the distance between a side of the channel layer 21 and the gate electrode 30 opposite the channel layer 21 is great compared with a case where the protection film 70 is not left. As a result, the influence of an electric field applied from the gate electrode 30 to the channel layer 21 (two-dimensional carrier gas 28 generated in the channel layer 21) is suppressed. By using the semiconductor device 1B having the structure illustrated in FIG. 15B, that is to say, the structure in which the protection film 70 is left on the side 80*a* of the insulating film 80, deterioration in performance caused by a short circuit between the gate electrode 30 and the channel layer 21 is also suppressed.

Figure 16A:
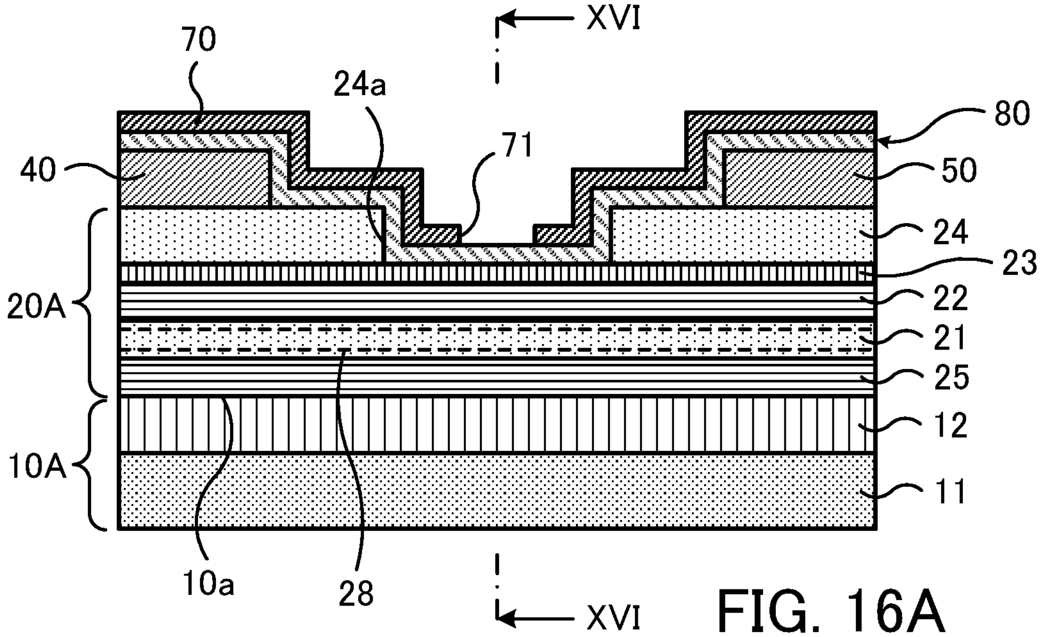
FIGS. 16A and 16B are views for describing an example of a method for manufacturing the semiconductor device according to the third embodiment.
Figure 16B:
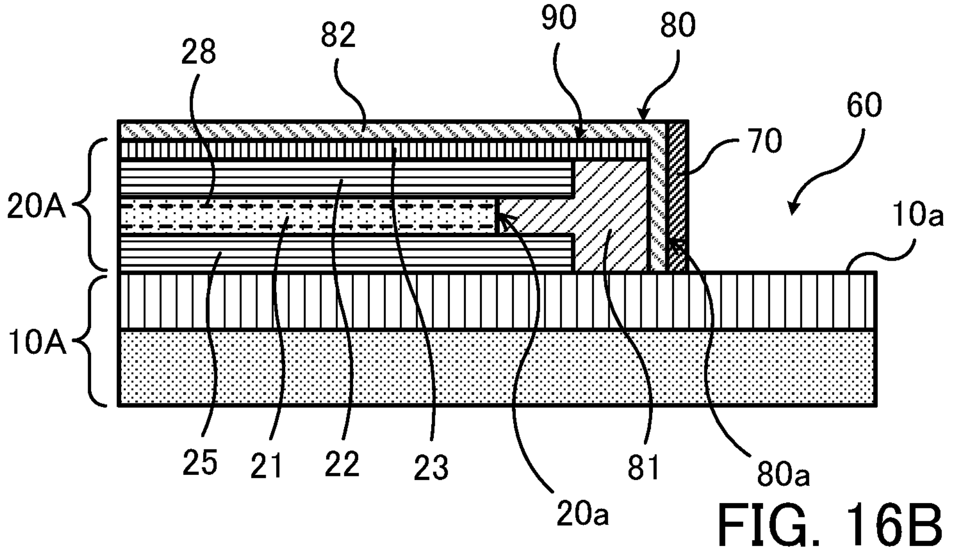

FIGS. 16A and 16B are views for describing an example of a method for manufacturing the semiconductor device according to the third embodiment. Each of FIGS. 16A and 16B is a fragmentary schematic sectional view of an example of an opening portion formation process. FIG. 16B is an example of a schematic sectional view taken along the line XVI-XVI of FIG. 16A.

In order to manufacture the semiconductor device 1B, the same processes that are illustrated in FIG. 8A through FIG. 13B and described in the above second embodiment may be adopted. That is to say, first the formation of the substrate 10A and the semiconductor layer 20A (FIGS. 8A and 8B), the formation of an element isolation region 60 (FIGS. 9A and 9B), the formation of a first insulating portion 81 (FIGS. 10A and 10B), the formation of a source electrode 40, a drain electrode 50, and a recess 24*a* (FIGS. 11A and 11B), the formation of a second insulating portion 82 (FIGS. 12A and 12B), and the formation of the protection film 70 (FIGS. 13A and 13B) are performed. After that, an opening portion 71 illustrated in FIG. 16A and FIG. 16B is formed in the protection film 70.

For example, when the opening portion 71 is formed by dry etching, a resist mask (not illustrated) is formed so as to cover the protection film 70 formed on the side 80*a* of the insulating film 80. As a result, the protection film 70 formed on the side 80*a* of the insulating film 80 is protected against fluorine-based gas used at the time of forming the opening portion 71 by dry etching. Accordingly, as illustrated in FIG. 16B, the protection film 70 is left on the side 80*a* of the insulating film 80. Even if the protection film 70 formed on the side 80*a* of the insulating film 80 is not covered with a resist mask, the protection film 70 may be left on the side 80*a* by controlling the thickness of the protection film 70 formed on the side 80*a* or a dry etching condition.

Fourth Embodiment

Figure 17A:
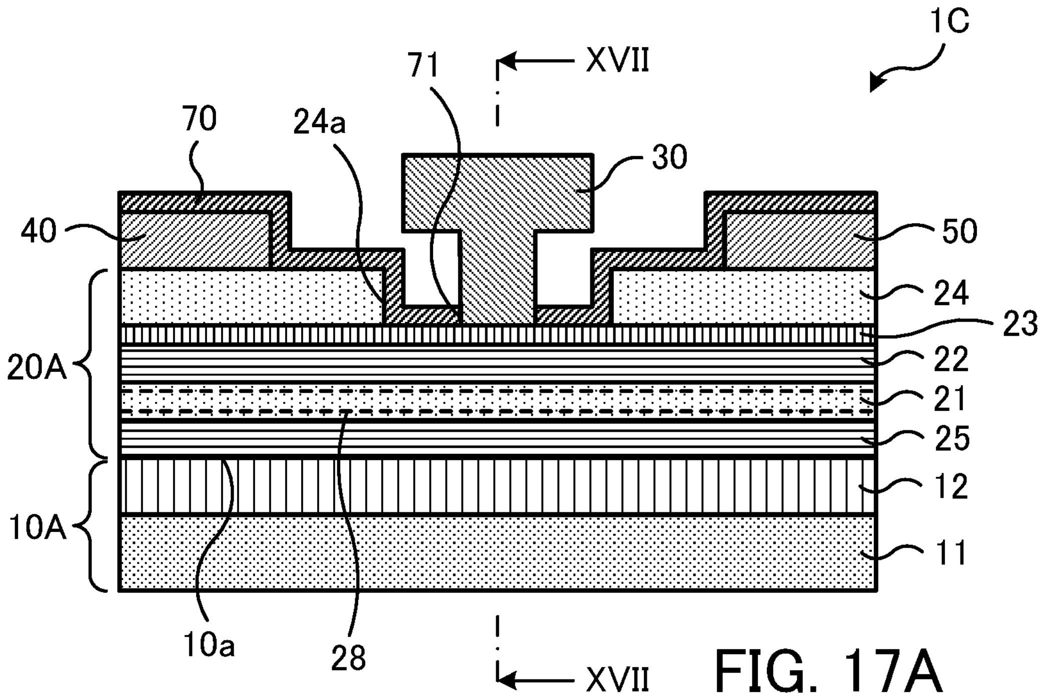
FIGS. 17A and 17B are views for describing an example of a semiconductor device according to a fourth embodiment.
Figure 17B:
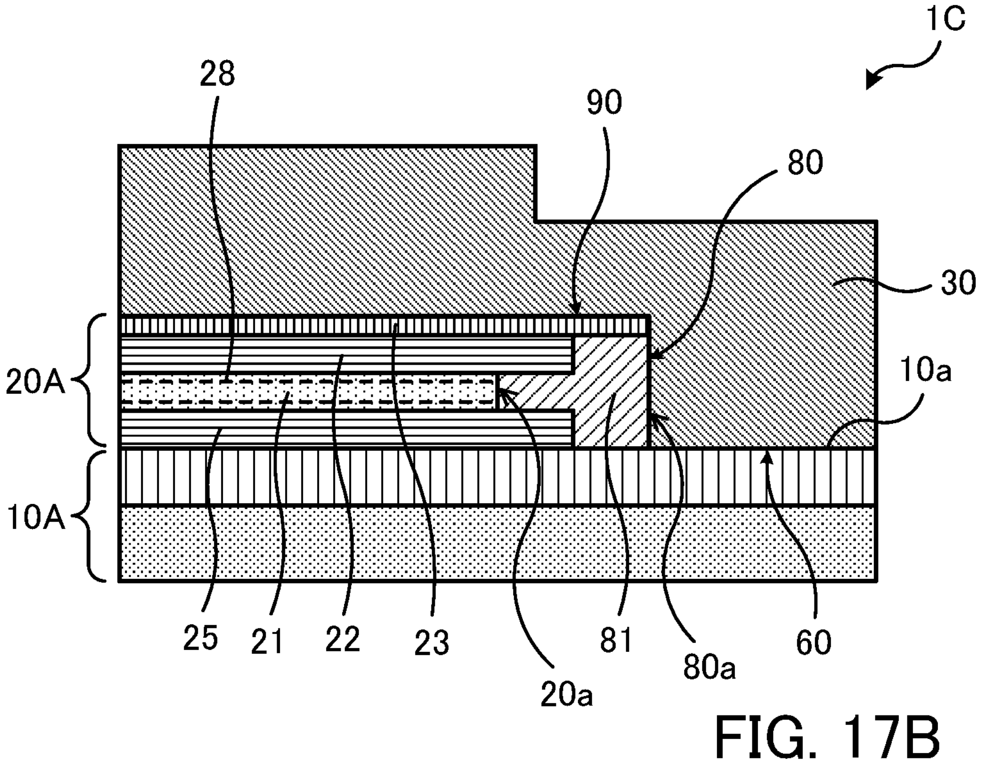

FIGS. 17A and 17B are views for describing an example of a semiconductor device according to a fourth embodiment. Each of FIGS. 17A and 17B is a fragmentary schematic sectional view of an example of a semiconductor device. FIG. 17B is an example of a schematic sectional view taken along the line XVII-XVII of FIG. 17A.

A semiconductor device 1C illustrated in FIGS. 17A and 17B has a structure in which an insulating film 80 is formed only under an etching stop layer 23 of a semiconductor layer 20A and in which an insulating film 80 is not formed at the side of the etching stop layer 23. That is to say, the semiconductor device 1C has a structure in which, of a carrier supply layer 25, a channel layer 21, a carrier supply layer 22, the etching stop layer 23, and a cap layer 24 of the semiconductor layer 20A, the insulating film 80 is formed only on sides of the carrier supply layer 25, the channel layer 21, and the carrier supply layer 22. The semiconductor device 1C has a structure in which, of the first insulating portion 81 and the second insulating portion 82 described in the above second embodiment, only the first insulating portion 81 is formed as the insulating film 80. The semiconductor device 1C differs from the semiconductor device 1A described in the above second embodiment in that it has the above structure.

With the semiconductor device 1C the sides of the carrier supply layer 22, the channel layer 21, and the carrier supply layer 25 on a side 20*a* of the semiconductor layer 20A are covered with the first insulating portion 81 formed as the insulating film 80. This suppresses contact between a gate electrode 30 and the channel layer 21 on the side 20*a* of the semiconductor layer 20A and a short circuit between the gate electrode 30 and the channel layer 21 caused by contact between them. Accordingly, deterioration in the performance of the semiconductor device 1C is suppressed.

The semiconductor device 1C has the structure in which, of the first insulating portion 81 and the second insulating portion 82 described in the above second embodiment, only the first insulating portion 81 is formed as the insulating film 80 and the second insulating portion 82 is not formed. In order to manufacture the semiconductor device 1C, the formation of a substrate 10A and the semiconductor layer 20A (FIGS. 8A and 8B), the formation of an element isolation region 60 (FIGS. 9A and 9B), the formation of the first insulating portion 81 (FIGS. 10A and 10B), and the formation of a source electrode 40, a drain electrode 50, and a recess 24*a* (FIGS. 11A and 11B) described in the above second embodiment are performed. After that, the formation of the second insulating portion 82 (FIGS. 12A and 12B) is omitted and the formation of a protection film 70 (FIGS. 13A and 13B) and the formation of an opening portion 71 (FIGS. 14A and 14B) are performed in accordance with the examples of FIGS. 13A and 13B and FIGS. 14A and 14B. Furthermore, the formation of the gate electrode 30 (FIGS. 17A and 17B) is performed. When the semiconductor device 1C is manufactured, a process for forming the second insulating portion 82 is omitted. As a result, man-hours decrease and manufacturing efficiency improves.

Furthermore, because the formation of the second insulating portion 82 is omitted, the opening portion 71 which communicates with the etching stop layer 23 is formed in the protection film 70 and the gate electrode 30 is formed over the etching stop layer 23 in the opening portion 71. A lower end of the gate electrode 30 formed in the opening portion 71 is in contact with the etching stop layer 23. With the semiconductor device 1C, the gate electrode 30 is Schottky-connected to the semiconductor layer 20A and a gate insulating film does not intervene between the gate electrode 30 and the semiconductor layer 20A. That is to say, a Schottky-type gate structure is realized.

With the semiconductor device 1C the protection film 70 may be left on a side 80*a* of the first insulating portion 81 formed as the insulating film 80 in accordance with the example described in the above third embodiment.

Fifth Embodiment

Figure 18A:
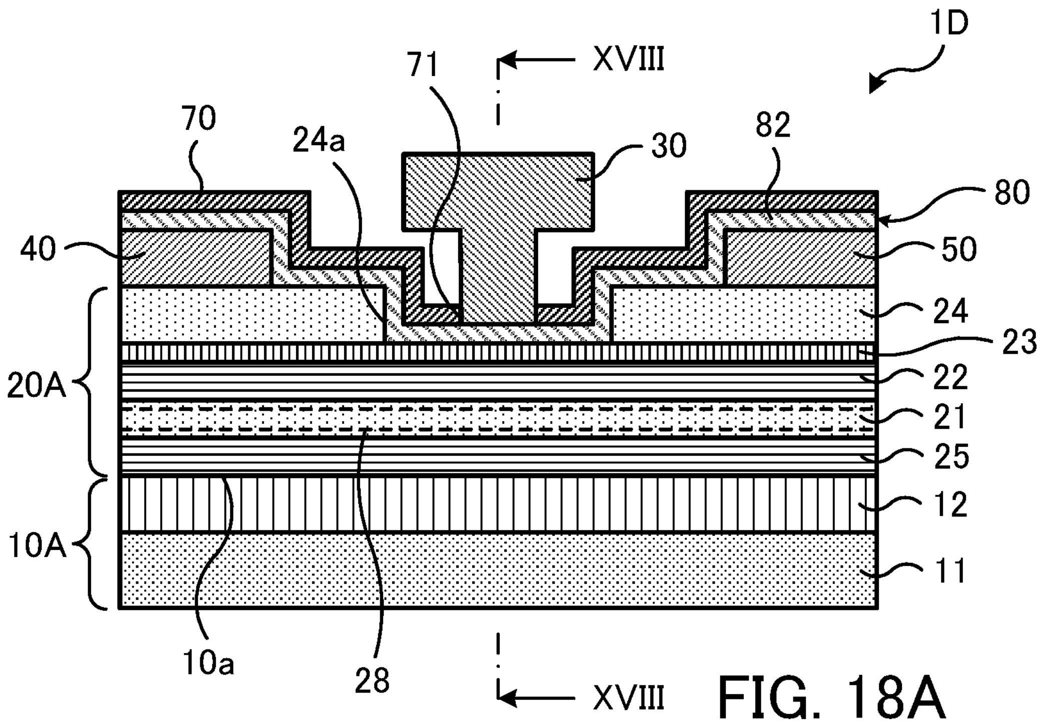
FIGS. 18A and 18B are views for describing an example of a semiconductor device according to a fifth embodiment.
Figure 18B:
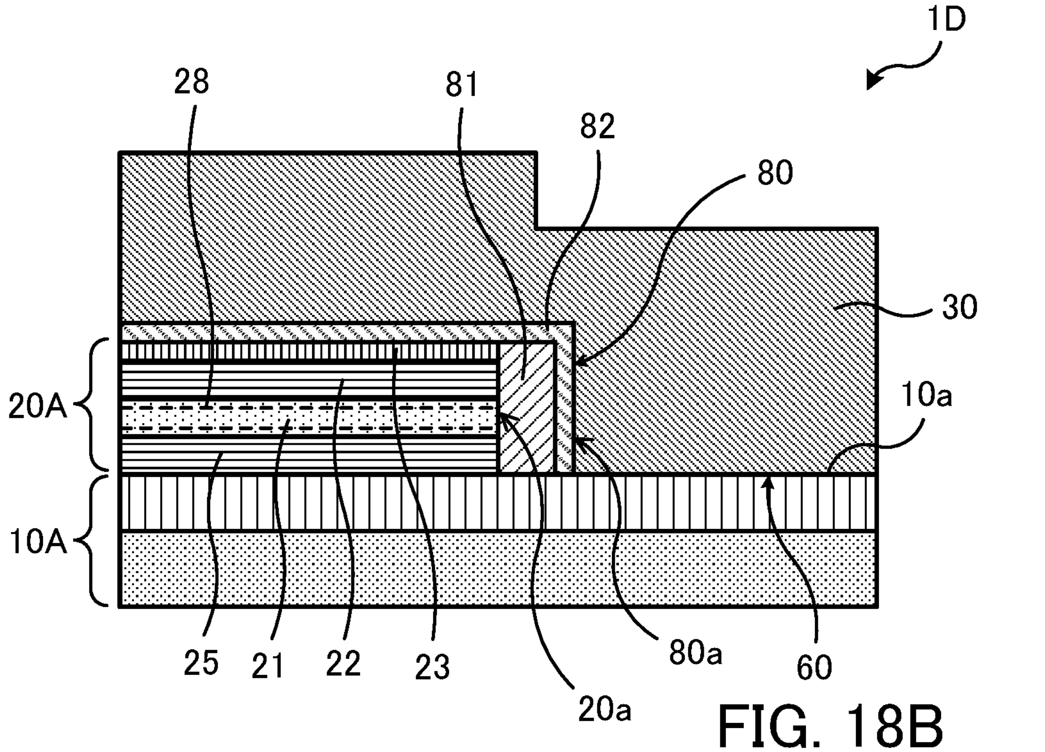

FIGS. 18A and 18B are views for describing an example of a semiconductor device according to a fifth embodiment. Each of FIGS. 18A and 18B is a fragmentary schematic sectional view of an example of a semiconductor device. FIG. 18B is an example of a schematic sectional view taken along the line XVIII-XVIII of FIG. 18A.

A semiconductor device 1D illustrated in FIGS. 18A and 18B has a structure in which sides of a carrier supply layer 25, a channel layer 21, a carrier supply layer 22, and an etching stop layer 23 are at the same or approximately the same position on a side 20*a* of a semiconductor layer 20A. With the semiconductor device 1D a side of a cap layer 24 of the semiconductor layer 20A is also at the same or approximately the same position as the sides of the carrier supply layer 25, the channel layer 21, the carrier supply layer 22, and the etching stop layer 23 are (not illustrated). In the above second embodiment the side 20*a* has the shape of a level difference. That is to say, the carrier supply layer 25 and the carrier supply layer 22 extrude outward from the channel layer 21 and the etching stop layer 23 extrudes outward from the carrier supply layer 25 and the carrier supply layer 22. With the semiconductor device 1D, however, the shape of a level difference described in the above second embodiment is not adopted. The semiconductor device 1D differs from the semiconductor device 1A described in the above second embodiment in that it has the above structure.

The semiconductor layer 20A of the semiconductor device 1D having the side 20*a* which is comparatively flat in shape is realized by controlling an etching condition at the time of the formation of an element isolation region 60 (FIGS. 9A and 9B) which is performed after the formation of a substrate 10A and the semiconductor layer 20A (FIGS. 8A and 8B) described in the above second embodiment. After the cap layer 24 and the etching stop layer 23 are etched, the carrier supply layer 22, the channel layer 21, and the carrier supply layer 25 are etched so that the sides of the carrier supply layer 22, the channel layer 21, and the carrier supply layer 25 will be at the same or approximately the same position as the side of the etching stop layer 23 is. By properly controlling a condition, such as a solution, time, temperature, or stirring speed, at the time of etching each layer, the semiconductor layer 20A, as of the semiconductor device 1D, having the side 20*a* which is comparatively flat in shape is realized.

After the semiconductor layer 20A having the side 20*a* which is comparatively flat in shape is formed, each process is performed in accordance with the example described in the above second embodiment. That is to say, the formation of a first insulating portion 81 (FIGS. 10A and 10B), the formation of a source electrode 40, a drain electrode 50, and a recess 24*a* (FIGS. 11A and 11B), the formation of a second insulating portion 82 (FIGS. 12A and 12B), the formation of a protection film 70 (FIGS. 13A and 13B), the formation of an opening portion 71 (FIGS. 14A and 14B), and the formation of a gate electrode 30 (FIGS. 18A and 18B) are performed. The first insulating portion 81 is formed so as to cover at least the carrier supply layer 25, the channel layer 21, and the carrier supply layer 22 of the carrier supply layer 25, the channel layer 21, the carrier supply layer 22, the etching stop layer 23, and the cap layer 24 on the side 20*a* of the semiconductor layer 20A.

With the semiconductor device 1D the side 20*a* of the semiconductor layer 20A is covered with the first insulating portion 81 and the second insulating portion 82 of an insulating film 80. This suppresses contact between the gate electrode 30 and the channel layer 21 on the side 20*a* of the semiconductor layer 20A and a short circuit between the gate electrode 30 and the channel layer 21 caused by contact between them. Accordingly, deterioration in the performance of the semiconductor device 1D is suppressed.

With the semiconductor device 1D the opening portion 71 is formed in the protection film 70 by dry etching using fluorine-based gas. At this time the exposure of the side 20*a* of the semiconductor layer 20A to fluorine-based gas is suppressed by the insulating film 80. Accordingly, even if the above peak portion 90 including the carrier supply layer 22 and the etching stop layer 23 is not formed over the channel layer 21, contact between the gate electrode 30 and the channel layer 21 on the side 20*a* of the semiconductor layer 20A and a short circuit between the gate electrode 30 and the channel layer 21 caused by contact between them are suppressed.

With the semiconductor device 1D the protection film 70 may be left on a side 80*a* of the insulating film 80 in accordance with the example described in the above third embodiment.

Sixth Embodiment

Figure 19A:
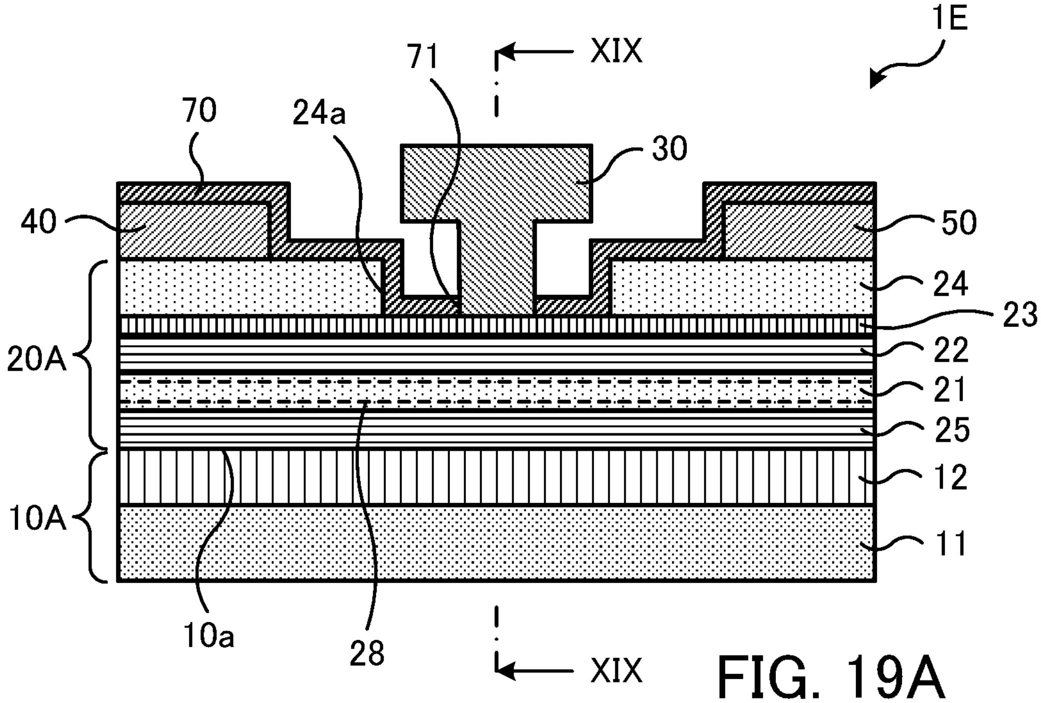
FIGS. 19A and 19B are views for describing an example of a semiconductor device according to a sixth embodiment.
Figure 19B:
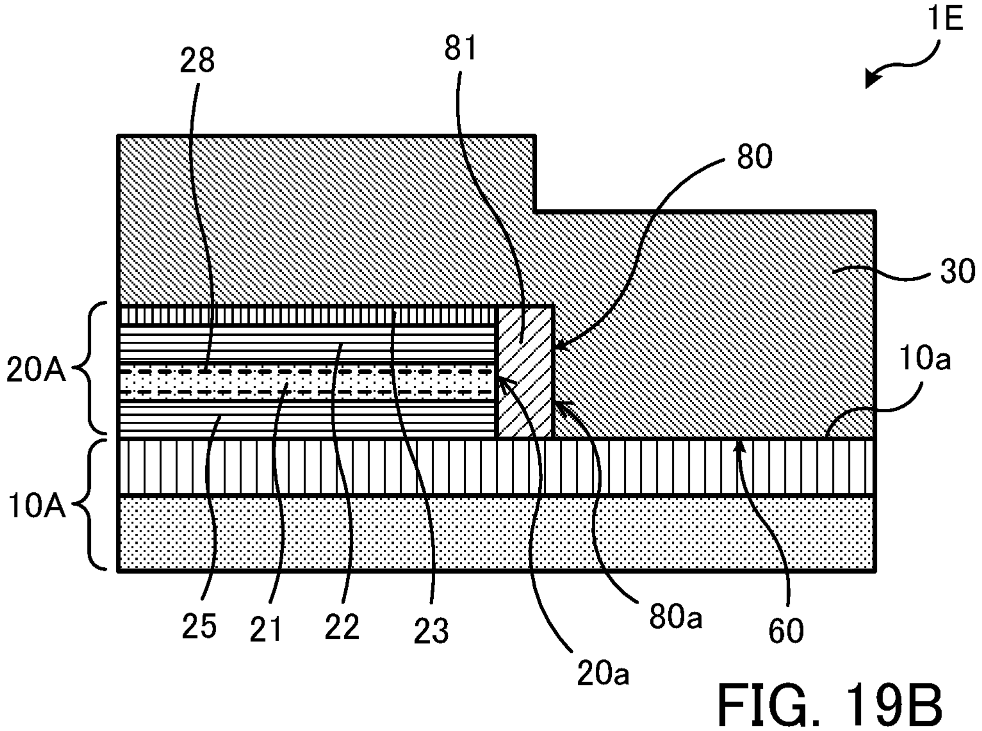

FIGS. 19A and 19B are views for describing an example of a semiconductor device according to a sixth embodiment. Each of FIGS. 19A and 19B is a fragmentary schematic sectional view of an example of a semiconductor device. FIG. 19B is an example of a schematic sectional view taken along the line XIX-XIX of FIG. 19A.

A semiconductor device 1E illustrated in FIGS. 19A and 19B has a structure in which only the first insulating portion 81, of the first insulating portion 81 and the second insulating portion 82 described in the above fifth embodiment, is formed as an insulating film 80. The semiconductor device 1E differs from the semiconductor device 1D described in the above fifth embodiment in that it has the above structure. The first insulating portion 81 is formed so as to cover, of a carrier supply layer 25, a channel layer 21, a carrier supply layer 22, an etching stop layer 23, and a cap layer 24 on a side 20*a* of a semiconductor layer 20A, at least the carrier supply layer 25, the channel layer 21, and the carrier supply layer 22.

With the semiconductor device 1E the side 20*a* of the semiconductor layer 20A is covered with the first insulating portion 81 formed as the insulating film 80. This suppresses contact between a gate electrode 30 and the channel layer 21 on the side 20*a* of the semiconductor layer 20A and a short circuit between the gate electrode 30 and the channel layer 21 caused by contact between them. Accordingly, deterioration in the performance of the semiconductor device 1E is suppressed.

When the semiconductor device 1E is manufactured, a process for forming the second insulating portion 82 is omitted. As a result, man-hours decrease and manufacturing efficiency improves. Furthermore, because the formation of the second insulating portion 82 is omitted, an opening portion 71 which communicates with the etching stop layer 23 is formed in a protection film 70 and the gate electrode 30 is formed over the etching stop layer 23 in the opening portion 71. A lower end of the gate electrode 30 formed in the opening portion 71 is in contact with the etching stop layer 23. With the semiconductor device 1E, the gate electrode 30 is Schottky-connected to the semiconductor layer 20A and a gate insulating film does not intervene between the gate electrode 30 and the semiconductor layer 20A. That is to say, a Schottky-type gate structure is realized.

With the semiconductor device 1E the protection film 70 may be left on a side 80*a* of the insulating film 80 in accordance with the example described in the above third embodiment.

The first through sixth embodiments have been described.

In the above description an example in which fluorine-based gas is used in dry etching for forming the opening portion 71 in the protection film 70 is mainly taken. However, etching gas other than fluorine-based gas may be used in the dry etching.

For example, the semiconductor devices 1, 1A, 1B, 1C, 1D, 1E having the structures described in the first through sixth embodiments, respectively, are applied to various electronic devices. For example, a case where the semiconductor devices having the above structures are applied to a semiconductor package, a power factor correction circuit, a power supply device, or an amplifier will now be described.

Seventh Embodiment

An example in which the semiconductor devices having the above structures are applied to a semiconductor package will now be described as a seventh embodiment.

Figure 20:
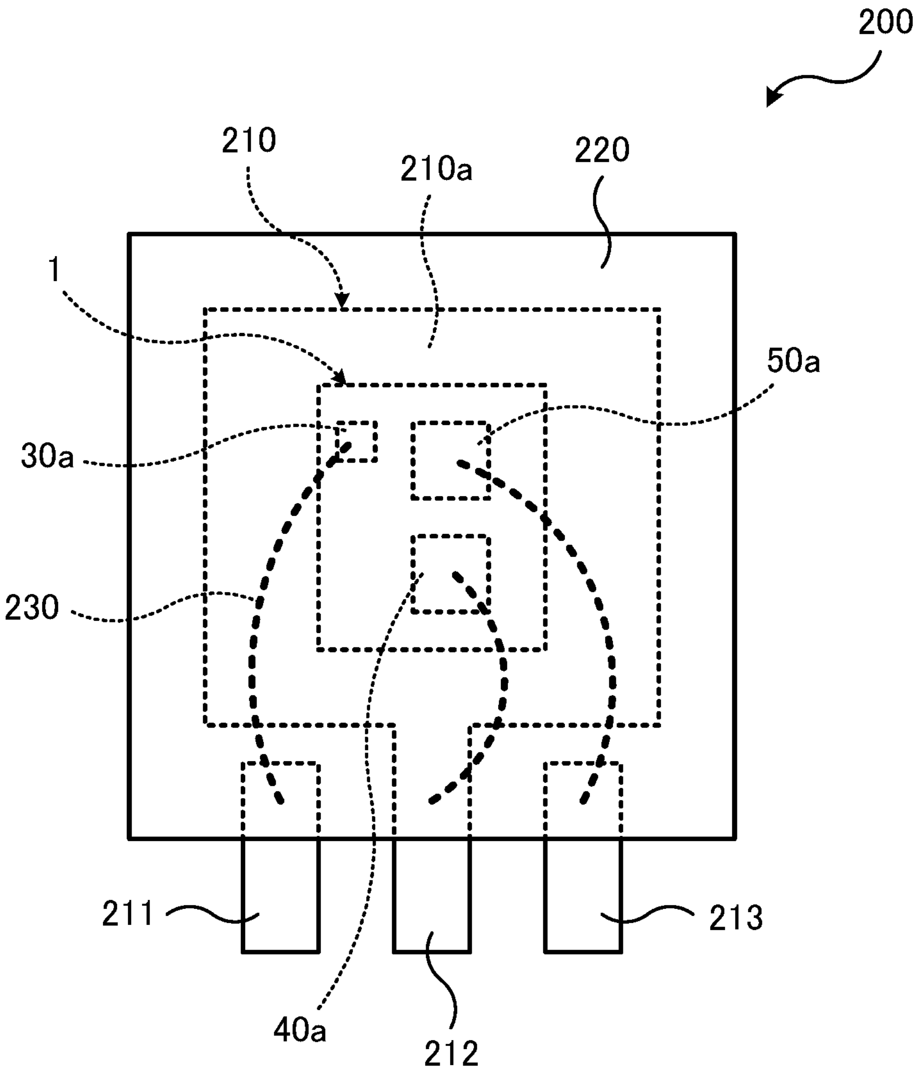
FIG. 20 is a view for describing an example of a semiconductor package according to a seventh embodiment.

FIG. 20 is a view for describing an example of a semiconductor package according to a seventh embodiment. FIG. 20 is a fragmentary schematic plan view of an example of a semiconductor package.

A semiconductor package 200 illustrated in FIG. 20 is an example of a discrete package. For example, the semiconductor package 200 includes the semiconductor device 1 (FIG. 5) described in the above first embodiment, a lead frame 210 over which the semiconductor device 1 is mounted, and resin 220 with which they are sealed.

For example, the semiconductor device 1 is mounted over a die pad 210*a* of the lead frame 210 by the use of a die attach material or the like (not illustrated). A pad 30*a* connected to the above gate electrode 30, a pad 40*a* connected to the source electrode 40, and a pad 50*a* connected to the drain electrode 50 are formed over the semiconductor device 1. The pad 30*a*, the pad 40*a*, and the pad 50*a* are connected to a gate lead 211, a source lead 212, and a drain lead 213, respectively, of the lead frame 210 by the use of wires 230 made of Au, Al, or the like. The lead frame 210, the semiconductor device 1 mounted thereover, and the wires 230 which connect the lead frame 210 and the semiconductor device 1 are sealed with the resin 220 so that part of the gate lead 211, part of the source lead 212, and part of the drain lead 213 will be exposed.

An external connection electrode connected to the source electrode 40 may be formed on a surface of the semiconductor device 1 on the opposite side of a surface over which the pad 30*a* connected to the gate electrode 30 and the pad 50*a* connected to the drain electrode 50 are formed. A conductive bonding material, such as solder, may be used for connecting the external connection electrode to the die pad 210*a* which connects with the source lead 212.

For example, the semiconductor device 1 described in the above first embodiment is used and the semiconductor package 200 having the above structure is obtained.

With the semiconductor device 1, as stated above, the side 20*a* of the semiconductor layer 20 formed by the element isolation region 60 is covered with the insulating film 80 containing metal. Because the side 20*a* of the semiconductor layer 20 is covered with the insulating film 80, the exposure of the side 20*a* of the semiconductor layer 20 to fluorine-based gas used in dry etching performed for forming the opening portion 71 in the protection film 70 which covers the semiconductor layer 20 is suppressed. This suppresses the disappearance of part of the side 20*a* of the semiconductor layer 20 and contact between the gate electrode 30 and the channel layer 21 on the side 20*a* of the semiconductor layer 20. As a result, a short circuit between the gate electrode 30 and the channel layer 21 caused by contact between them is suppressed. Accordingly, deterioration in performance caused by a short circuit between the gate electrode 30 and the channel layer 21 is suppressed and the high performance semiconductor device 1 is realized. This semiconductor device 1 is used and the high performance semiconductor package 200 is realized.

In the above case, the semiconductor device 1 is taken as an example. However, the semiconductor device 1A, 1B, 1C, 1D, 1E, or the like other than the semiconductor device 1 may be used in the same way for obtaining a semiconductor package.

Eighth Embodiment

An example in which the semiconductor devices having the above structures are applied to a power factor correction circuit will now be described as an eighth embodiment.

Figure 21:
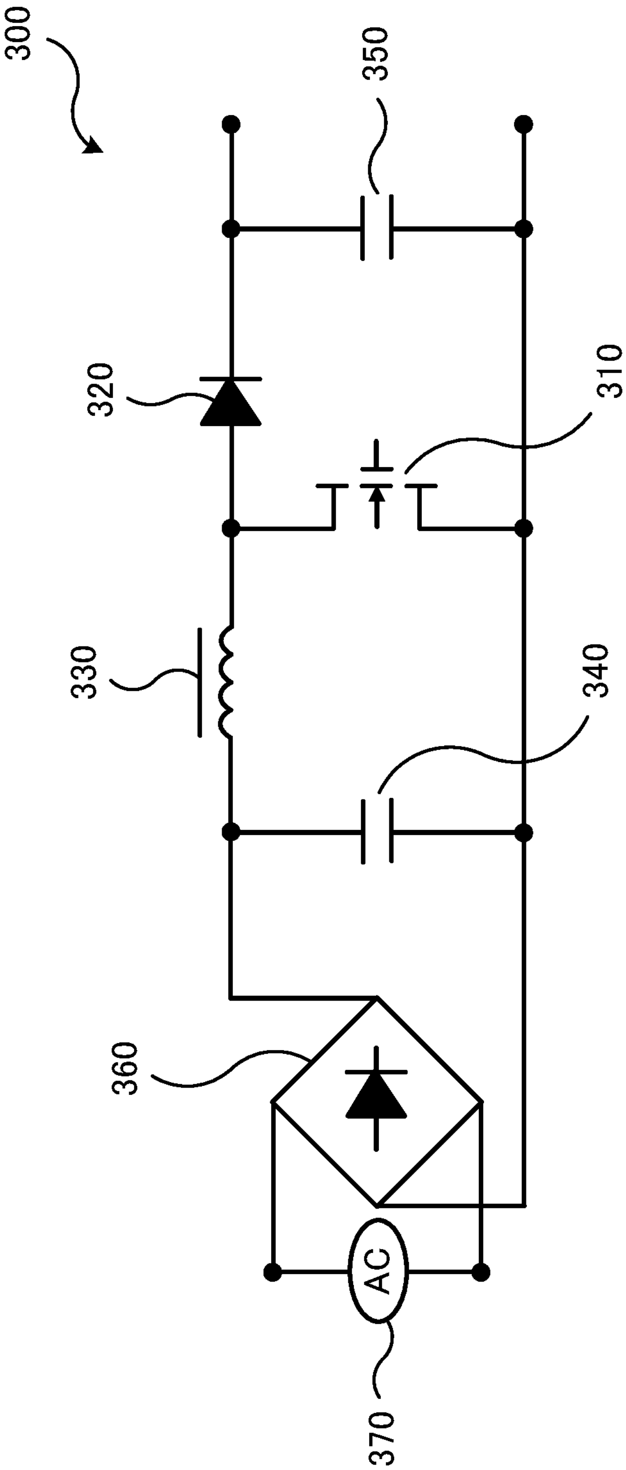
FIG. 21 is a view for describing an example of a power factor correction circuit according to an eighth embodiment.

FIG. 21 is a view for describing an example of a power factor correction circuit according to an eighth embodiment. FIG. 21 illustrates an equivalent circuit of an example of a power factor correction circuit.

A power factor correction (PFC) circuit 300 illustrated in FIG. 21 includes a switching element 310, a diode 320, a choke coil 330, a capacitor 340, a capacitor 350, a diode bridge 360, and an alternating-current power supply 370 (AC).

In the PFC circuit 300, a drain electrode of the switching element 310 is connected to an anode terminal of the diode 320 and one terminal of the choke coil 330. A source electrode of the switching element 310 is connected to one terminal of the capacitor 340 and one terminal of the capacitor 350. The other terminal of the capacitor 340 is connected to the other terminal of the choke coil 330. The other terminal of the capacitor 350 is connected to a cathode terminal of the diode 320. Furthermore, a gate driver is connected to a gate electrode of the switching element 310. The alternating-current power supply 370 is connected between both terminals of the capacitor 340 via the diode bridge 360 and a direct-current power supply (DC) is taken from both terminals of the capacitor 350.

For example, the above the semiconductor device 1, 1A, 1B, 1C, 1D, 1E, or the like is used as the switching element 310 included in the PFC circuit 300 having the above structure.

With the semiconductor device 1, 1A, 1B, 1C, 1D, 1E, or the like, as stated above, the side 20*a* of the semiconductor layer 20 or 20A formed by the element isolation region 60 is covered with the insulating film 80 containing metal. Because the side 20*a* of the semiconductor layer 20 or 20A is covered with the insulating film 80, the exposure of the side 20*a* of the semiconductor layer 20 or 20A to fluorine-based gas used in dry etching performed for forming the opening portion 71 in the protection film 70 which covers the semiconductor layer 20 or 20A is suppressed. This suppresses the disappearance of part of the side 20*a* of the semiconductor layer 20 or 20A and contact between the gate electrode 30 and the channel layer 21 on the side 20*a* of the semiconductor layer 20 or 20A. As a result, a short circuit between the gate electrode 30 and the channel layer 21 caused by contact between them is suppressed. Accordingly, deterioration in performance caused by a short circuit between the gate electrode 30 and the channel layer 21 is suppressed and the high performance semiconductor device 1, 1A, 1B, 1C, 1D, 1E, or the like is realized. This semiconductor device 1, 1A, 1B, 1C, 1D, 1E, or the like is used and the high performance PFC circuit 300 is realized.

Ninth Embodiment

An example in which the semiconductor devices having the above structures are applied to a power supply device will now be described as a ninth embodiment.

Figure 22:
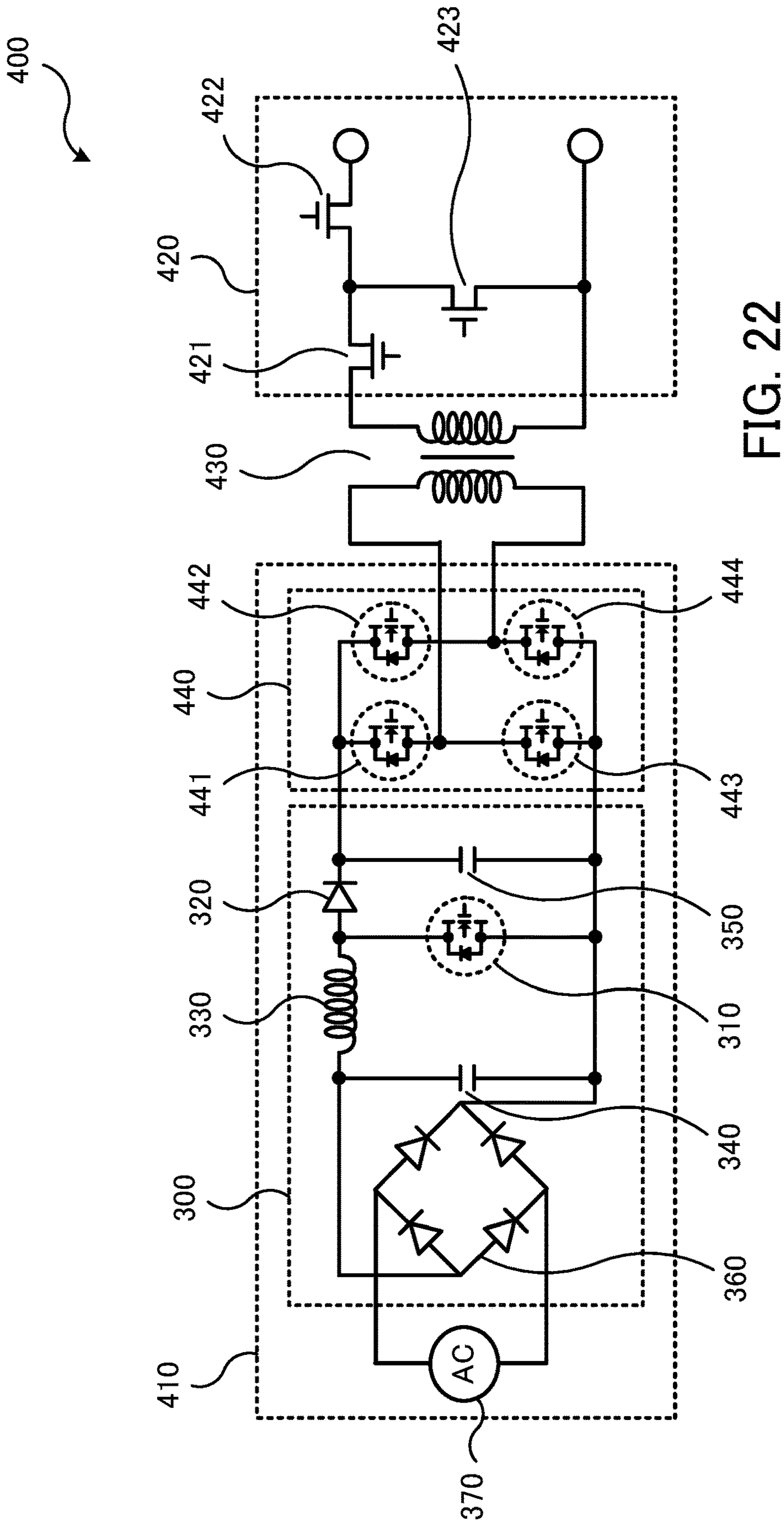
FIG. 22 is a view for describing an example of a power supply device according to a ninth embodiment.

FIG. 22 is a view for describing an example of a power supply device according to a ninth embodiment. FIG. 22 illustrates an equivalent circuit of an example of a power supply device.

A power supply device 400 illustrated in FIG. 22 includes a primary-side circuit 410, a secondary-side circuit 420, and a transformer 430 located between the primary-side circuit 410 and the secondary-side circuit 420.

The primary-side circuit 410 includes the PFC circuit 300 described in the above eighth embodiment and an inverter circuit (full-bridge inverter circuit 440, for example) connected between both terminals of the capacitor 350 of the PFC circuit 300. The full-bridge inverter circuit 440 includes a plurality of switching elements. In this case, for example, the full-bridge inverter circuit 440 includes a switching element 441, a switching element 442, a switching element 443, and a switching element 444.

The secondary-side circuit 420 includes a plurality of switching elements. In this case, for example, the secondary-side circuit 420 includes a switching element 421, a switching element 422, and a switching element 423.

With the power supply device 400 having the above structure, for example, the above semiconductor device 1, 1A, 1B, 1C, 1D, 1E, or the like is used as the switching element 310 of the PFC circuit 300 included in the primary-side circuit 410 and the switching elements 441, 442, 443, and 444 of the full-bridge inverter circuit 440 included in the primary-side circuit 410. For example, an ordinary MIS-type field-effect transistor made of Si is used as the switching elements 421, 422, and 423 included in the secondary-side circuit 420 of the power supply device 400.

With the semiconductor device 1, 1A, 1B, 1C, 1D, 1E, or the like, as stated above, the side 20*a* of the semiconductor layer 20 or 20A formed by the element isolation region 60 is covered with the insulating film 80 containing metal. Because the side 20*a* of the semiconductor layer 20 or 20A is covered with the insulating film 80, the exposure of the side 20*a* of the semiconductor layer 20 or 20A to fluorine-based gas used in dry etching performed for forming the opening portion 71 in the protection film 70 which covers the semiconductor layer 20 or 20A is suppressed. This suppresses the disappearance of part of the side 20*a* of the semiconductor layer 20 or 20A and contact between the gate electrode 30 and the channel layer 21 on the side 20*a* of the semiconductor layer 20 or 20A. As a result, a short circuit between the gate electrode 30 and the channel layer 21 caused by contact between them is suppressed. Accordingly, deterioration in performance caused by a short circuit between the gate electrode 30 and the channel layer 21 is suppressed and the high performance semiconductor device 1, 1A, 1B, 1C, 1D, 1E, or the like is realized. This semiconductor device 1, 1A, 1B, 1C, 1D, 1E, or the like is used and the high performance power supply device 400 is realized.

Tenth Embodiment

An example in which the semiconductor devices having the above structures are applied to an amplifier will now be described as a tenth embodiment.

Figure 23:
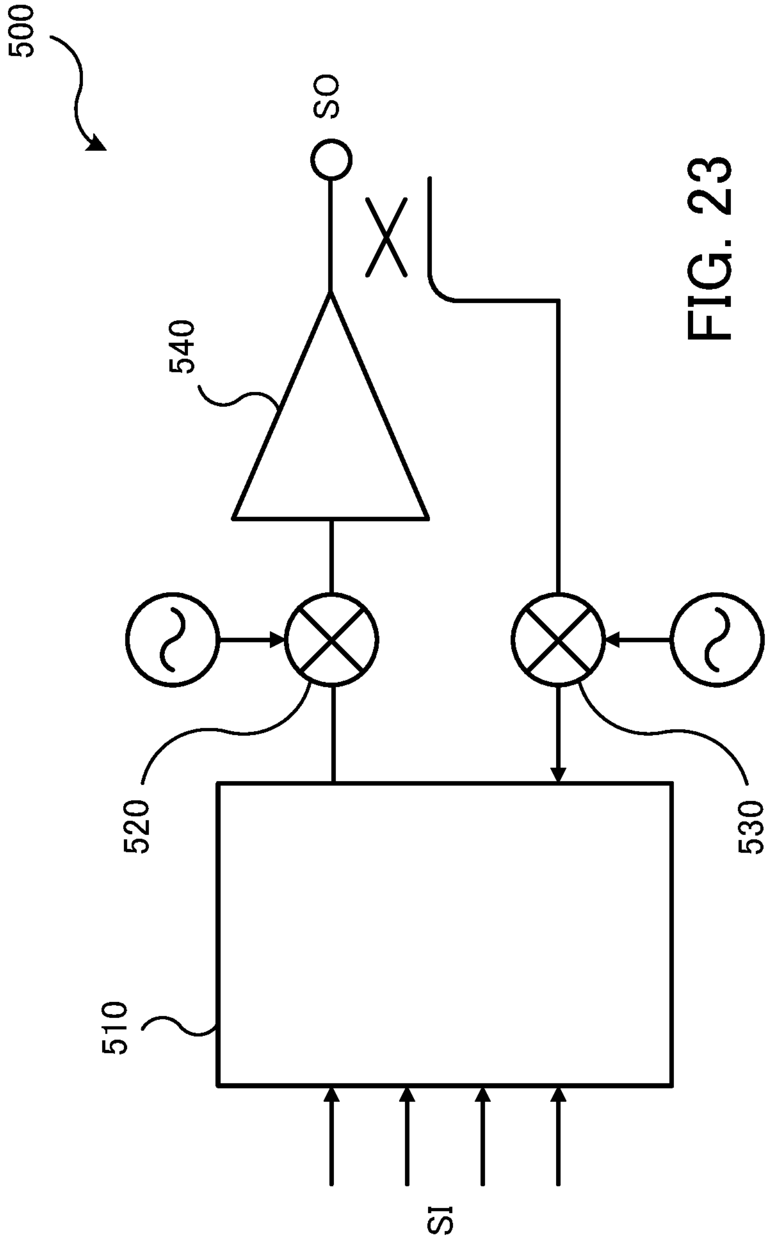
FIG. 23 is a view for describing an example of an amplifier according to a tenth embodiment.

FIG. 23 is a view for describing an example of an amplifier according to a tenth embodiment. FIG. 23 illustrates an equivalent circuit of an example of an amplifier.

An amplifier 500 illustrated in FIG. 23 includes a digital predistortion circuit 510, a mixer 520, a mixer 530, and a power amplifier 540.

The digital predistortion circuit 510 compensates for nonlinear distortion of an input signal. The mixer 520 mixes an input signal SI whose nonlinear distortion has been compensated for with an alternating-current signal. The power amplifier 540 amplifies a signal obtained by mixing the input signal SI with the alternating-current signal. With the amplifier 500, for example, a switch is switched. By doing so, an output signal SO is mixed with an alternating-current signal by the mixer 530 and a signal obtained is transmitted to the digital predistortion circuit 510. The amplifier 500 is used as a high-frequency amplifier or a high output amplifier.

The above semiconductor device 1, 1A, 1B, 1C, 1D, 1E, or the like is used as the power amplifier 540 of the amplifier 500 having the above structure.

With the semiconductor device 1, 1A, 1B, 1C, 1D, 1E, or the like, as stated above, the side 20*a* of the semiconductor layer 20 or 20A formed by the element isolation region 60 is covered with the insulating film 80 containing metal. Because the side 20*a* of the semiconductor layer 20 or 20A is covered with the insulating film 80, the exposure of the side 20*a* of the semiconductor layer 20 or 20A to fluorine-based gas used in dry etching performed for forming the opening portion 71 in the protection film 70 which covers the semiconductor layer 20 or 20A is suppressed. This suppresses the disappearance of part of the side 20*a* of the semiconductor layer 20 or 20A and contact between the gate electrode 30 and the channel layer 21 on the side 20*a* of the semiconductor layer 20 or 20A. As a result, a short circuit between the gate electrode 30 and the channel layer 21 caused by contact between them is suppressed. Accordingly, deterioration in performance caused by a short circuit between the gate electrode 30 and the channel layer 21 is suppressed and the high performance semiconductor device 1, 1A, 1B, 1C, 1D, 1E, or the like is realized. This semiconductor device 1, 1A, 1B, 1C, 1D, 1E, or the like is used and the high performance amplifier 500 is realized.

Various electronic devices (such as the semiconductor package 200, the PFC circuit 300, the power supply device 400, and the amplifier 500 described in the above seventh through tenth embodiments respectively) to which the above semiconductor device 1, 1A, 1B, 1C, 1D, 1E, or the like is applied are mounted in various electronic apparatus or electronic devices such as computers (personal computers, supercomputers, servers, and the like), smartphones, portable telephones, tablet terminals, sensors, cameras, audio equipment, measuring equipment, inspection equipment, manufacturing equipment, transmitters, receivers, and radar equipment.

According to an aspect, a semiconductor device which suppresses deterioration in performance caused by a short circuit between a semiconductor layer and an electrode is realized.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device comprising:

a substrate having a first surface;

a semiconductor layer provided on a first surface side of the substrate where the first surface is provided;

a first insulating film provided so as to cover the semiconductor layer over the substrate, having an opening portion, and containing silicon (Si);

a source electrode and a drain electrode provided over the semiconductor layer and opposite each other with the opening portion therebetween;

a gate electrode provided in the opening portion of the first insulating film between the source electrode and the drain electrode and on a second surface side of the semiconductor layer where a side surface of the semiconductor layer which faces a first direction parallel to the first surface of the substrate and perpendicular to an opposing direction of the source electrode and the drain electrode is provided; and a second insulating film provided between the side surface of the semiconductor layer and the gate electrode provided on the second surface side and containing a metal element.

2. The semiconductor device according to claim 1, wherein the first insulating film extends to the second surface side of the semiconductor layer and is provided between the second insulating film and the gate electrode provided on the second surface side.

3. The semiconductor device according to claim 1, wherein:

the semiconductor layer includes:

a first layer including a channel layer and a carrier supply layer provided over the channel layer; and a second layer provided over the first layer on an opposite side of the substrate, and the second insulating film covers the first layer, of the first layer and the second layer on the side surface of the semiconductor layer.

4. The semiconductor device according to claim 3, wherein:

the opening portion of the first insulating film communicates with the semiconductor layer on the opposite side of the substrate from the semiconductor layer; and the gate electrode provided in the opening portion is in contact with the semiconductor layer.

5. The semiconductor device according to claim 1, wherein:

the semiconductor layer includes:

a first layer including a channel layer and a carrier supply layer provided over the channel layer; and a second layer provided over the first layer on an opposite side of the substrate, and the second insulating film covers the first layer and the second layer on the side surface of the semiconductor layer and extends on the semiconductor layer to the opposite side of the substrate.

6. The semiconductor device according to claim 5, wherein:

the opening portion of the first insulating film communicates with the second insulating film on the opposite side of the substrate from the semiconductor layer; and the gate electrode provided in the opening portion is in contact with the second insulating film.

7. The semiconductor device according to claim 5, wherein:

the second insulating film includes:

a first portion which covers the first layer on the side surface of the semiconductor layer and which has a first thickness from the first layer in the first direction parallel to the first surface of the substrate; and a second portion which covers the second layer on the side surface of the semiconductor layer, which extends on the semiconductor layer to the opposite side of the substrate, and which has a second thickness less than the first thickness from the second layer in the first direction parallel to the first surface of the substrate.

8. The semiconductor device according to claim 5, wherein the second layer has a shape by which the second layer extrudes from the first layer toward the gate electrode provided on the second surface side in the first direction parallel to the first surface of the substrate.

9. The semiconductor device according to claim 5, wherein:

the second layer has a shape by which the second layer extrudes from the carrier supply layer of the first layer toward the gate electrode provided on the second surface side in the first direction parallel to the first surface of the substrate; and the carrier supply layer of the first layer has a shape by which the carrier supply layer extrudes from the channel layer of the first layer toward the gate electrode provided on the second surface side in the first direction parallel to the first surface of the substrate.

10. The semiconductor device according to claim 5, wherein a thickness of the second layer in a second direction perpendicular to the first surface of the substrate is half or less of a thickness of the channel layer of the first layer in the second direction.

11. The semiconductor device according to claim 5, wherein:

the channel layer of the first layer includes indium gallium arsenide (InGaAs);

the carrier supply layer of the first layer includes indium aluminum arsenide (InAlAs); and the second layer includes indium phosphide (InP) or indium gallium phosphide (InGaP).

12. The semiconductor device according to claim 1, wherein the metal element contained in the second insulating film has an electronegativity of 1.8 or less.

13. The semiconductor device according to claim 1, wherein the second insulating film contains as the metal element one or more of aluminum (Al), hafnium (Hf), zirconium (Zr), titanium (Ti), tantalum (Ta), magnesium (Mg), scandium (Sc), yttrium (Y), lanthanum (La), and strontium (Sr).

14. The semiconductor device according to claim 1, wherein the second insulating film includes one or more of an oxide film, a nitride film, and an oxynitride film.

15. A semiconductor device manufacturing method comprising:

providing a semiconductor layer on a first surface side of a substrate where the first surface is provided;

providing a first insulating film so as to cover the semiconductor layer over the substrate, the first insulating film having an opening portion and containing silicon (Si);

providing a source electrode and a drain electrode over the semiconductor layer, the source electrode and the drain electrode being opposite each other with the opening portion therebetween;

providing a gate electrode in the opening portion of the first insulating film between the source electrode and the drain electrode and on a second surface side of the semiconductor layer where a side surface of the semiconductor layer which faces a first direction parallel to the first surface of the substrate and perpendicular to an opposing direction of the source electrode and the drain electrode is provided; and providing a second insulating film between the side surface of the semiconductor layer and the gate electrode provided on the second surface side, the second insulating film containing a metal element, the providing of the second insulating film being performed before the providing of the first insulating film.

16. The semiconductor device manufacturing method according to claim 15, wherein:

the providing of the first insulating film includes providing the first insulating film extending to the second surface side of the semiconductor layer; and the first insulating film extending to the second surface side of the semiconductor layer is provided between the second insulating film and the gate electrode provided on the second surface side.

17. The semiconductor device manufacturing method according to claim 15, wherein the providing of the first insulating film includes providing the opening portion by an etching using a gas.

18. An electronic device comprising a semiconductor device including:

a substrate having a first surface;

a semiconductor layer provided on a first surface side of the substrate where the first surface is provided;

a first insulating film provided so as to cover the semiconductor layer over the substrate, having an opening portion, and containing silicon (Si);

a source electrode and a drain electrode provided over the semiconductor layer and opposite each other with the opening portion therebetween;

a gate electrode provided in the opening portion of the first insulating film between the source electrode and the drain electrode and on a second surface side of the semiconductor layer where a side surface of the semiconductor layer which faces a first direction parallel to the first surface of the substrate and perpendicular to an opposing direction of the source electrode and the drain electrode is provided; and a second insulating film provided between the side surface of the semiconductor layer and the gate electrode provided on the second surface side and containing a metal element.

* * * * *